US009759781B2

(12) United States Patent
Ohtake

(10) Patent No.: US 9,759,781 B2
(45) Date of Patent: Sep. 12, 2017

(54) BATTERY MONITORING SYSTEM AND BATTERY MONITORING CHIP

(71) Applicant: LAPIS SEMICONDUCTOR CO., LTD., Kanagawa (JP)

(72) Inventor: Hisao Ohtake, Kanagawa (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 219 days.

(21) Appl. No.: 14/625,140

(22) Filed: Feb. 18, 2015

(65) Prior Publication Data
US 2015/0241520 A1     Aug. 27, 2015

(30) Foreign Application Priority Data

Feb. 25, 2014  (JP) ................. 2014-034256

(51) Int. Cl.
*H02J 7/00* (2006.01)
*H02J 7/14* (2006.01)
*G01R 31/36* (2006.01)

(52) U.S. Cl.
CPC ....... *G01R 31/3658* (2013.01); *G01R 31/362* (2013.01); *G01R 31/3682* (2013.01); *H02J 7/007* (2013.01); *H02J 7/0013* (2013.01); *H02J 7/0014* (2013.01); *H02J 7/0021* (2013.01); *H02J 7/0022* (2013.01)

(58) Field of Classification Search
USPC ........ 320/116, 118, 134, 162, 119, 122, 120, 320/132, 136, 163, 165, 166; 324/434, 324/426, 433
See application file for complete search history.

(56) References Cited

U.S. PATENT DOCUMENTS

| 5,850,136 A * | 12/1998 | Kaneko ................. H02J 7/0016 320/119 |
| 7,471,065 B2 * | 12/2008 | Emori ................. B60L 11/1855 320/116 |
| 7,816,891 B2 * | 10/2010 | Nebrigic ............... H02J 7/0022 320/136 |
| 8,089,248 B2 * | 1/2012 | Tabatowski-Bush  H01M 10/4207 320/116 |

(Continued)

FOREIGN PATENT DOCUMENTS

| JP | 2011-233413 | 11/2011 |
| JP | 2012-161182 | 8/2012 |

*Primary Examiner* — Alexis Pacheco
(74) *Attorney, Agent, or Firm* — Volentine & Whitt, PLLC

(57) ABSTRACT

The battery monitoring chips each include a battery monitoring function section that is provided so as to correspond to a respective battery cell group and to monitor a state of each battery cell contained in the corresponding battery cell group, and a regulator that generates a drive voltage to supply to a configuration circuit of the battery monitoring function section based on power supplied from the battery. The battery monitoring chips are connected together in series to give a communication path, with an input end of the regulator electrically connected to an output end of another regulator. A microcomputer is connected to a battery monitoring chip, and is driven by a drive voltage generated by the regulator of the battery monitoring chip accompanying power consumption by each of the battery cells.

10 Claims, 12 Drawing Sheets

(56) References Cited

U.S. PATENT DOCUMENTS

| | | | | |
|---|---|---|---|---|
| 2003/0044689 A1* | 3/2003 | Miyazaki | .............. | H02J 7/0026 429/320 |
| 2011/0285352 A1* | 11/2011 | Lim | ...................... | H02J 7/0019 320/118 |
| 2011/0291618 A1* | 12/2011 | Li | ........................ | H02J 7/0021 320/116 |
| 2013/0057289 A1* | 3/2013 | Ishikawa | ............ | G01R 31/3658 324/426 |
| 2013/0099747 A1* | 4/2013 | Baba | .................... | H02J 7/0019 320/118 |
| 2013/0110430 A1* | 5/2013 | Nishi | ................... | H01M 10/48 702/63 |
| 2013/0162259 A1* | 6/2013 | Wynne | ................. | G01R 31/362 324/433 |

* cited by examiner

BATTERY MONITORING SYSTEM AND BATTERY MONITORING CHIP

CROSS-REFERENCE TO RELATED APPLICATION

This application is based on and claims priority under 35 USC 119 from Japanese Patent Application No. 2014-034256 filed on Feb. 25, 2014, the disclosure of which is incorporated by reference herein.

BACKGROUND

Technical Field

The present invention relates to a battery monitoring system and battery monitoring chip.

Related Art

Battery monitoring systems are known that monitor the respective states of plural battery cells of a battery (battery assembly) configured by connecting the plural battery cells together in series.

For example, Japanese Patent Application Laid-Open (JP-A) No. 2011-233413 (Patent Document 1) describes a configuration of a system including plural voltage detection ICs connected together in series by a communication path, and a main microcomputer that controls each of plural voltage detection ICs through the voltage detection IC at one end. In the Patent Document 1, the respective voltage detection ICs are described as being provided with a power source circuit that receives power supply from the battery cell and generates drive voltage to drive its own internal circuit.

JP-A No. 2012-161182 (Patent Document 2) describes a configuration for detecting voltage of each battery cell that has been grouped together using a monitoring IC for each block, and suppressing variation in the current consumed by each of the blocks when outputting an output signal from each of the monitoring ICs.

An object of the present invention is to control variation in the power consumption amount between battery cell groups in a battery monitoring system including plural battery monitoring chips, each equipped with a voltage generation section that generates a drive voltage for driving its own internal circuit with power supplied from a battery including plural battery cells, provided so as to correspond to each of the battery cell groups.

SUMMARY

In order to achieve the above objective, a battery monitoring system, for a battery containing plural battery cells connected together in series, wherein mutually different portions from the plural battery cells form plural battery cell groups, according to the present invention includes: plural battery monitoring chips that each includes a battery monitoring function section that is provided so as to correspond to one of the battery cell groups and monitors a state of each of battery cell included in the corresponding battery cell group, and a voltage generation section that generates a drive voltage to supply to a configuration circuit of the battery monitoring function section based on power supplied from the battery, wherein the plural battery monitoring chips are connected together in series with a communication path for performing communication between each other, with an input end of the voltage generation section electrically connected to an output end of another voltage generation section; and a driven section that is connected to one battery monitoring chip from out of the plural battery monitoring chips, and that is driven by a drive voltage generated by the voltage generation section of the one battery monitoring chip accompanying power consumption by each of the plural battery cells A battery monitoring chip according to the present invention includes: a battery monitoring function section that, out of plural battery cells of a battery containing the plural battery cells connected together in series, is provided so as to correspond to one battery cell group out of plural battery cell groups each including a mutually different portion of battery cells from out of the plural battery cells and to monitor a state of each of plural battery cells configuring the one battery cell group connected together in series; a first terminal that is input with a higher voltage than the voltage of the battery cell group; a voltage generation section that is driven by voltage input to the first terminal and generates a drive voltage to supply to a configuration circuit of the battery monitoring function section; and a second terminal that outputs the drive voltage generated by the voltage generation section.

According to the present invention, variation in the power consumption amount between battery cell groups can be suppressed in a battery monitoring system including plural battery monitoring chips, each equipped with a voltage generation section that generates a drive voltage for driving its own internal circuit with power supplied from the battery including plural battery cells, provided so as to correspond to each of the battery cell groups.

DETAILED DESCRIPTION

Figure 1:
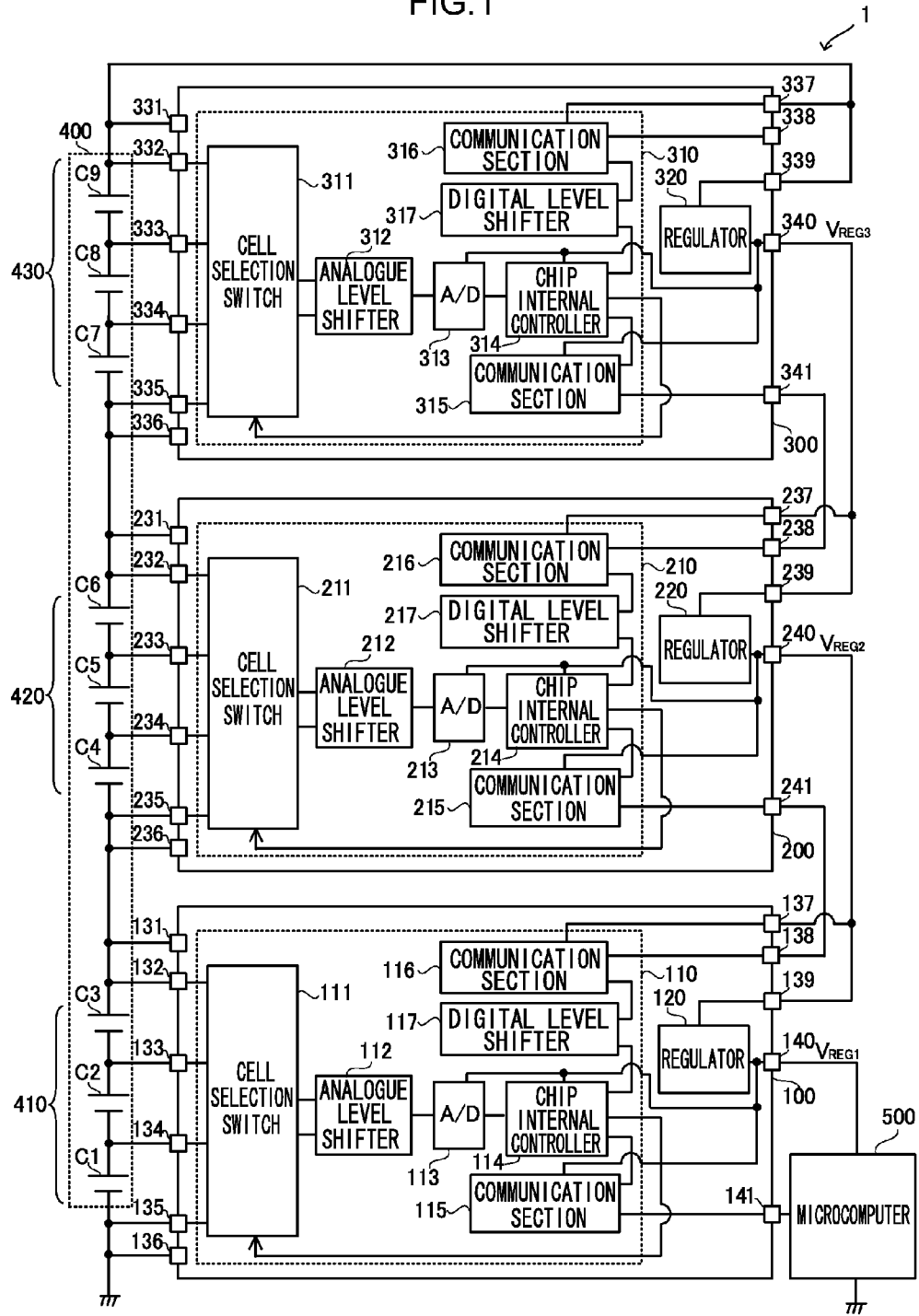
FIG. 1 is a block diagram illustrating a configuration of a battery monitoring system according to an exemplary embodiment of the present invention.

Explanation follows regarding exemplary embodiments of the present invention, with reference to the drawings. The same reference numerals are appended to the same or corresponding configuration elements in each of the drawings.

First Exemplary Embodiment

FIG. 1 is a block diagram illustrating a configuration of a battery monitoring system 1 according to a first exemplary embodiment of the present invention. The battery monitoring system 1 is for monitoring the voltage of each of plural battery cells C1 to C9 contained in a battery 400. The battery monitoring system 1 is, for example, configured including 3 battery monitoring chips 100, 200, 300, and a microcomputer 500 serving as a driven section that performs integrated control of the 3 battery monitoring chips 100, 200, 300. In the present exemplary embodiment, the battery monitoring chips 100, 200, 300 and the microcomputer 500 are each configured as separate semiconductor chips.

The battery 400 monitored by the battery monitoring system 1 is, for example, configured including the 9 battery cells C1 to C9 connected together in series. The battery 400 is split into groups so that each group includes 3 battery cells that are different from each other, forming battery cell groups 410, 420 and 430. The battery monitoring chip 100 is provided corresponding to the lowest electrical potential battery cell group 410, and monitors the voltage state of each of the battery cells C1 to C3 included in the battery cell group 410. The battery monitoring chip 200 is provided corresponding to the mid position electrical potential battery cell group 420, and monitors the voltage state of each of the battery cells C4 to C6 included in the battery cell group 420. The battery monitoring chip 300 is provided corresponding to the highest electrical potential battery cell group 430, and monitors the voltage state of each of the battery cells C7 to C9 included in the battery cell group 430. The battery cells C4 to C6 configuring the battery cell group 420 monitored by the battery monitoring chip 200 have higher electrical potentials than the battery cells C1 to C3 configuring the battery cell group 410 monitored by the battery monitoring chip 100. Similarly, the battery cells C7 to C9 configuring the battery cell group 430 monitored by the battery monitoring chip 300 have higher electrical potentials than the battery cells C4 to C6 and the battery cells C1 to C3 respectively configuring the battery cell group 420 and the battery cell group 410 monitored by the battery monitoring chip 200 and the battery monitoring chip 100. In the present specification, as viewed from a given battery monitoring chip, a battery monitoring chip that monitors the voltage of respective battery cells belong to a battery cell group of higher electrical potential is referred to as "a higher position battery monitoring chip". As viewed from a given battery monitoring chip, a battery monitoring chip that monitors the voltage of respective battery cells belong to a battery cell group of lower electrical potential is referred to as "a lower position battery monitoring chip". For example, as viewed from the battery monitoring chip 100, the battery monitoring chips 200 and 300 are higher position battery monitoring chips. As viewed from the battery monitoring chip 200, the battery monitoring chip 100 is a lower position battery monitoring chip, and the battery monitoring chip 300 is a higher position battery monitoring chip. As viewed from the battery monitoring chip 300, the battery monitoring chips 100 and 200 are lower position battery monitoring chips.

Explanation follows regarding configuration of the battery monitoring chip 100. The battery monitoring chip 100 includes a power supply terminal 131, cell voltage input terminals 132 to 135 and a ground terminal 136. The power supply terminal 131 and the cell voltage input terminal 132 are connected to the positive electrode of the battery cell C3. The cell voltage input terminal 133 is connected to the negative electrode of the battery cell C3 (the positive electrode of the battery cell C2). The cell voltage input terminal 134 is connected to the negative electrode of the battery cell C2 (the positive electrode of the battery cell C1). The cell voltage input terminal 135 and the ground terminal 136 are connected to the negative electrode of the battery cell C1 and also to ground. The power supply terminal 131, the cell voltage input terminals 132 to 135, and the ground terminal 136 are configured as electrode pads for external electrical connection of the battery monitoring chip 100.

The battery monitoring chip 100 includes the battery monitoring function section 110 and a regulator 120. The battery monitoring function section 110 has a function for monitoring the battery voltages of the battery cells C1 to C3 included in the battery cell group 410 monitored by the battery monitoring chip 100 configured by the battery monitoring function section 110 itself. The battery monitoring function section 110 is configured including a cell selection switch 111, an analogue level shifter 112, an A/D converter 113, a chip internal controller 114, a communication section 115, a communication section 116, and a digital level shifter 117.

The cell selection switch 111 is connected to the cell voltage input terminals 132 to 135, respectively selects the positive electrode and the negative electrode of one of the battery cells C1 to C3 according to a control signal supplied from the chip internal controller 114, and outputs the respective voltages of the positive electrode and the negative electrode.

The analogue level shifter 112 is a difference voltage output circuit that outputs the difference voltage that is the difference between the positive electrode electrical potential and the negative electrode electrical potential of one of the battery cells C1 to C3 output from the cell selection switch 111, at a level with respect to the ground electrical potential input from the ground terminal 136.

The A/D converter 113 generates a digital signal according to the difference voltage that is the difference between the positive electrode electrical potential and the negative electrode electrical potential of one of the battery cells C1 to C3 output from the analogue level shifter 112, and supplies the generated digital signal to the chip internal controller 114. Namely, the A/D converter 113 converts the difference voltage that is the difference between the positive electrode electrical potential and the negative electrode electrical potential of one of the battery cells C1 to C3 output from the cell selection switch 111 to a digital signal, and supplies the digital signal to the chip internal controller 114.

The chip internal controller 114 controls the cell selection switch 111 according to a control signal supplied from the microcomputer 500. The chip internal controller 114 controls the transmission and reception of various signals and data between the microcomputer 500 and the higher position battery monitoring chip 200. For example, the chip internal controller 114 controls transfer of control signals and the like supplied from the microcomputer 500 to the higher position battery monitoring chip 200 as necessary. The chip internal controller 114 controls transfer of cell voltage measurement results and the like supplied from the A/D converter 113 or the higher position battery monitoring chip 200 to the microcomputer 500.

The communication section 115 performs transmission and reception of various signals between the chip internal controller 114 and the microcomputer 500. In order to enable the exchange of signals between the battery monitoring chip 100 and the microcomputer 500, the voltage range of the signals transmitted and received by the communication section 115 is set so as to be the same voltage range as signals capable of being input or output by the microcomputer 500. The communication section 116 performs transmission and reception of various signals to and from the higher position battery monitoring chip 200. In order to enable the exchange of signals between the battery monitoring chip 100 and the higher position battery monitoring chip 200, the voltage range of the signals transmitted and received by the communication section 116 is set so as to be the same voltage range as signals capable of being input or output by a chip internal controller 214 of the higher position battery monitoring chip 200, this being higher than the voltage range of signals transmitted and received by the communication section 115.

The digital level shifter 117 shifts the voltage range of signals received from the higher position battery monitoring chip 200 to the lower electrical potential side so that the voltage range of signals received from the higher position battery monitoring chip 200 is a voltage range detectable by the chip internal controller 114. The digital level shifter 117 shifts the voltage range of signals transmitted toward the higher position battery monitoring chip 200 to the high electrical potential side so that the voltage range of signals transmitted from the chip internal controller 114 toward the higher position battery monitoring chip 200 is a voltage range detectable by the chip internal controller 214 of the higher position battery monitoring chip 200.

The regulator 120 acts as a voltage generation section generating and supplying a fixed voltage (for example 5V) drive voltage $V_{REG1}$ in order to drive the A/D converter 113, the chip internal controller 114, and the communication section 115 that are the configuration circuit of the battery monitoring function section 110, based on power supplied from the battery 400. The regulator 120 is an example of a voltage generation section of the present invention.

The battery monitoring chip 100 includes a communication power supply terminal 137, a communication terminal 138, a regulator power supply terminal 139, a regulator output terminal 140, and a communication terminal 141.

The communication power supply terminal 137 is a terminal for inputting a drive voltage from outside for driving the communication section 116, and is connected to the power supply node of the communication section 116. The power supply node of the communication section 116 is a node supplied with drive voltage for driving the communication section 116.

The communication terminal 138 is a terminal that outputs signals transmitted from the communication section 116 to outside, and for inputting signals transmitted toward the communication section 116 from outside. The communication terminal 138 is connected to a signal input node of the communication section 116. The signal input node of the communication section 116 is a node through which signals input to the communication section 116 pass.

As an input end of the voltage generation section, the regulator power supply terminal 139 is a terminal that inputs a drive voltage from outside for driving the regulator 120, and is connected to the power supply node of the regulator 120. The power supply node of the regulator 120 is a node supplied with a drive voltage for driving the regulator 120. As an output end of the voltage generation section, the regulator output terminal 140 is a terminal that outputs the drive voltage $V_{REG1}$ generated by the regulator 120 to outside, and is connected to the output node of the regulator 120. The output node of the regulator 120 is a node that outputs the drive voltage $V_{REG1}$ generated by the regulator 120.

The communication terminal 141 is a terminal that outputs signals transmitted from the communication section 115 to outside, and for inputting signals transmitted toward the communication section 115 from outside. The communication terminal 141 is connected to a signal input-output node of the communication section 115. The signal input-output node of the communication section 115 is a node through which signals input and output to the communication section 115 pass.

In the battery monitoring chip 100, the signals input from the outside through the communication terminal 141 are output to the communication terminal 138 through the communication section 115, the chip internal controller 114, the digital level shifter 117 and the communication section 116. The signals input from outside through the communication terminal 138 are output to the communication terminal 141 through the communication section 116, the digital level shifter 117, the chip internal controller 114, and the communication section 115.

Configuration of the battery monitoring chip 100 has been explained above, and the configuration of the battery monitoring chips 200 and 300 are similar to the configuration of the battery monitoring chip 100. Namely, a cell selection switch 211, an analogue level shifter 212, an A/D converter 213, the chip internal controller 214, a communication section 215, a communication section 216, a digital level shifter 217, a regulator 220, and terminals 231 to 241 in the battery monitoring chip 200 respectively correspond to the cell selection switch 111, the analogue level shifter 112, the A/D converter 113, the chip internal controller 114, the communication section 115, the communication section 116, the digital level shifter 117, the regulator 120, and the terminals 131 to 141 in the battery monitoring chip 100. Moreover, a cell selection switch 311, an analogue level shifter 312, an A/D converter 313, a chip internal controller 314, a communication section 315, a communication section 316, a digital level shifter 317, a regulator 320, and terminals 331 to 341 in the battery monitoring chip 300 respectively correspond to the cell selection switch 111, the analogue level shifter 112, the A/D converter 113, the chip internal controller 114, the communication section 115, the communication section 116, the digital level shifter 117, the regulator 120, and the terminals 131 to 141 in the battery monitoring chip 100. Duplicate explanation of the battery monitoring chips 200 and 300 is accordingly omitted.

In the battery monitoring chip 200, the power supply terminal 231 and the cell voltage input terminal 232 are connected to the positive electrode of the battery cell C6. The cell voltage input terminal 233 is connected to the negative electrode of the battery cell C6 (the positive electrode of the battery cell C5). The cell voltage input terminal 234 is connected to the negative electrode of the battery cell C5 (the positive electrode of the battery cell C4). The cell voltage input terminal 235 and the ground terminal 236 are connected to the negative electrode of the battery cell C4 (the positive electrode of the battery cell C3).

In the battery monitoring chip 300, the power supply terminal 331 and the cell voltage input terminal 332 are connected to the positive electrode of the battery cell C9. The cell voltage input terminal 333 is connected to the negative electrode of the battery cell C9 (the positive electrode of the battery cell C8). The cell voltage input terminal 334 is connected to the negative electrode of the battery cell C8 (the positive electrode of the battery cell C7). The cell voltage input terminal 335 and the ground terminal 336 are connected to the negative electrode of the battery cell C7 (the positive electrode of the battery cell C6).

Explanation follows regarding the connection relationship between each of the configuration elements of the battery monitoring system. The communication terminal 141 of the battery monitoring chip 100 is connected to the signal input-output node of the microcomputer 500. In other words, the battery monitoring chip 100 and the microcomputer 500 are connected together through the communication terminal 141. The signal input-output node of the microcomputer 500 is a node through which signals input and output to and from the microcomputer 500 pass. This thereby enables communication between the battery monitoring chip 100 and the microcomputer 500. The communication terminal 138 of the battery monitoring chip 100 is connected to the communication terminal 241 of the battery monitoring chip 200, and this thereby enables communication between the battery monitoring chip 100 and the battery monitoring chip 200. Similarly, the communication terminal 238 of the battery monitoring chip 200 is connected to the communication terminal 341 of the battery monitoring chip 300, and this thereby enables communication between the battery monitoring chip 200 and the battery monitoring chip 300. The battery monitoring chips 100, 200, 300 and the microcomputer 500 accordingly have the communication paths for mutual communication between each other connected together in series so as to form a daisy chain, enabling mutual communication between each other. In the present exemplary embodiment, the communication paths for communication between the battery monitoring chips 100, 200, 300 are paths through the communication section 115, the chip internal controller 114, the digital level shifter 117, the communication section 116, the communication section 215, the chip internal controller 214, the digital level shifter 217, the communication section 216, the communication section 315, and the chip internal controller 314.

The regulator power supply terminal 339 of the battery monitoring chip 300 is an input terminal of the regulator 320, and is connected to the positive electrode of the battery cell C9 that outputs the highest electrical potential of the battery 400. The regulator power supply terminal 339 of the battery monitoring chip 300 is also connected to the power supply terminal 331 and the cell voltage input terminal 332. The regulator 320 of the battery monitoring chip 300 is driven by a voltage output from the positive electrode of the battery cell C9 and input through the regulator power supply terminal 339, and generates a drive voltage $V_{REG3}$. The drive voltage $V_{REG3}$ generated by the regulator 320 is supplied to the power supply node of the A/D converter 313, the power supply node of the chip internal controller 314, and the power supply node of the communication section 315 in the battery monitoring chip 300, and is also output from the regulator output terminal 340 that is an output end of the regulator 320. The power supply node of the A/D converter 313 is a node supplied with a drive voltage for driving the A/D converter 313. The power supply node of the chip internal controller 314 is a node supplied with a drive voltage for driving the chip internal controller 314. The power supply node of the communication section 315 is a node supplied with a drive voltage for driving the communication section 315. The regulator output terminal 340 is connected to the regulator power supply terminal 239 and the communication power supply terminal 237 of the lower position battery monitoring chip 200.

The regulator 220 of the battery monitoring chip 200 is driven by the drive voltage $V_{REG3}$ generated by the regulator 320 of the higher position battery monitoring chip 300, output from regulator output terminal 340, and input through the regulator power supply terminal 239 that is an input end of the regulator 220, and generates a drive voltage $V_{REG2}$. The drive voltage $V_{REG2}$ generated by the regulator 220 is supplied to the power supply node of the A/D converter 213, the power supply node of the chip internal controller 214, and the power supply node of the communication section 215 in the battery monitoring chip 200, and is also output from a regulator output terminal 240 that is an output end of the regulator 220. The power supply node of the A/D converter 213 is a node supplied with a drive voltage for driving the A/D converter 213. The power supply node of the chip internal controller 214 is a node supplied with a drive voltage for driving the chip internal controller 214. The power supply node of the communication section 215 is a node for supplying a drive voltage for driving the communication section 215. The regulator output terminal 240 is connected to a regulator power supply terminal 139 and the communication power supply terminal 137 of the lower position battery monitoring chip 100.

The regulator 120 of the battery monitoring chip 100 is driven by the drive voltage $V_{REG2}$ generated by the regulator 220 of the higher position battery monitoring chip 200 output from regulator output terminal 240, and input through the regulator power supply terminal 139 that is an input end of the regulator 120, and generates a drive voltage $V_{REG1}$. The drive voltage $V_{REG1}$ generated by the regulator 120 is supplied to the power supply node of the A/D converter 113, the power supply node of the chip internal controller 114, and the power supply node of the communication section 115 in the battery monitoring chip 100, and is also output from the regulator output terminal 140 that is an output end of the regulator 120. The power supply node of the A/D converter 113 is a node supplied with a drive voltage for driving the A/D converter 113. The power supply node of the chip internal controller 114 is a node supplied with a drive voltage for driving the chip internal controller 114. The power supply node of the communication section 115 is a node supplied with a drive voltage for driving the communication section 115. The regulator output terminal 140 is connected to a power supply node of the microcomputer 500. The power supply node of the microcomputer 500 is a node supplied with drive voltage for driving the microcomputer 500. The microcomputer 500 is driven by the drive voltage $V_{REG1}$ output from the regulator 120 of the battery monitoring chip 100. The microcomputer 500 is connected to the battery monitoring chip 100, that is one out of the battery monitoring chips 100, 200, 300, and is an example of a driven section of the present invention driven by the drive voltage $V_{REG1}$ generated by the regulator 120 of the one battery monitoring chip 100.

Thus in the battery monitoring system 1, as a voltage generation section, the input end of the regulator itself is connected to the output end of another regulator. Namely, in the battery monitoring system 1, the regulators 120, 220 of the battery monitoring chips 100, 200 other than the highest position battery monitoring chip 300 are driven by a drive voltage generated by the regulator of a higher position battery monitoring chip corresponding to a higher electrical potential battery cell group than its own battery cell group, and generate their own drive voltage. The battery monitoring chips 100, 200 are supplied with drive voltage supplied from the regulator of the higher position battery monitoring chip that monitors a higher position battery cell group than the battery cell group it is monitoring itself, through the regulator power supply terminals 139, 239 that are the input ends (first terminals) of the regulators, and output the drive voltage generated by the regulator itself through the regulator output terminals 140, 240 that are the output ends (second terminals) of the regulators. The regulator 320 of the highest position battery monitoring chip 300 is driven by the voltage of the highest electrical potential battery cell C9 of the battery 400. All of the regulators 120, 220, 320 are driven based on power supplied from the battery 400. The microcomputer 500 is driven by the drive voltage $V_{REG1}$ generated by the regulator 120 of the battery monitoring chip 100 connected to the microcomputer 500 itself.

Figure 2:
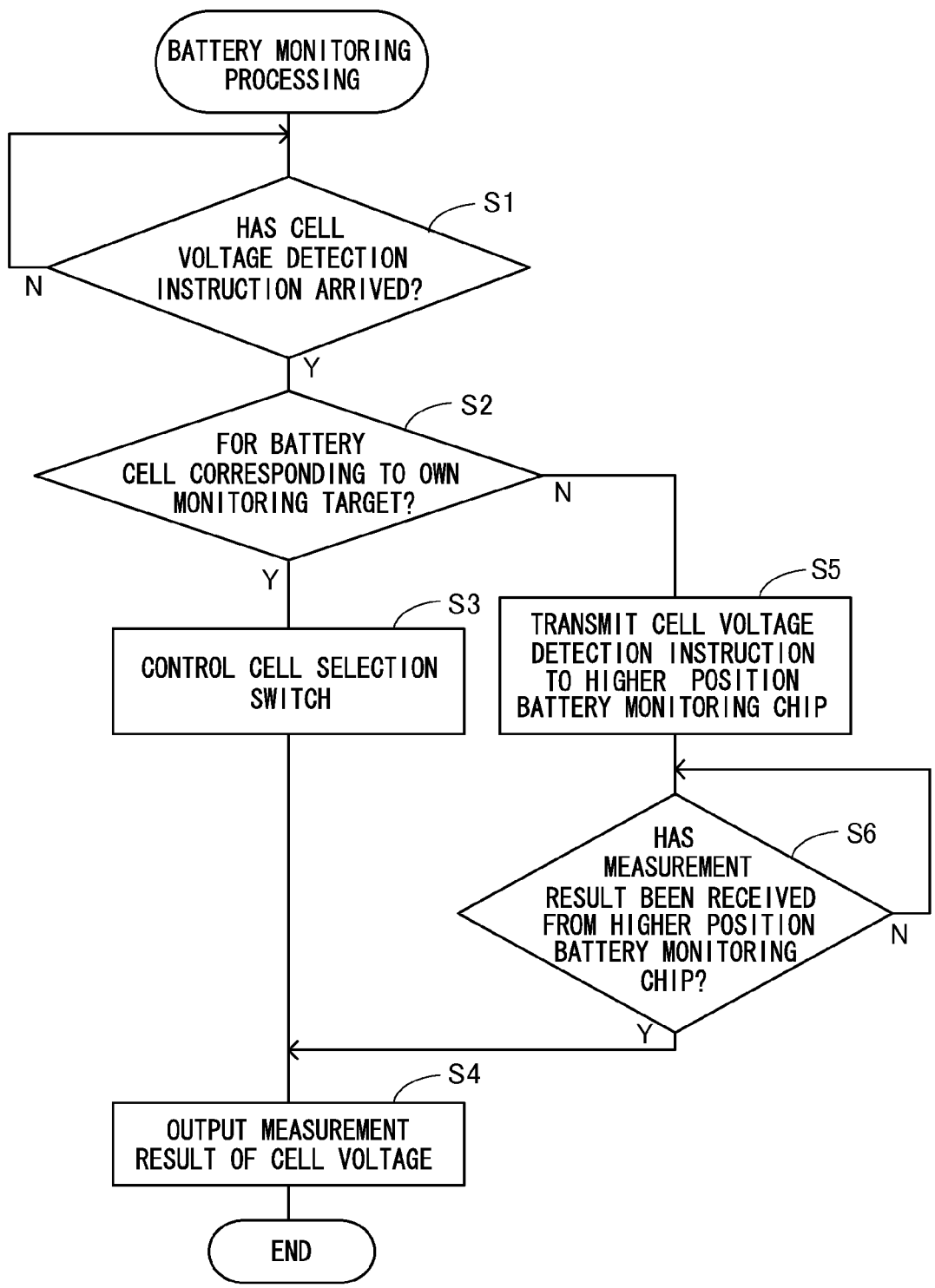
FIG. 2 is a flowchart illustrating a flow of processing in a battery monitoring processing program according to an exemplary embodiment of the present invention.

Explanation follows regarding processing in the battery monitoring system 1 to monitor the voltage (cell voltage) of each of the battery cells C1 to C9 configuring the battery 400. FIG. 2 is flowchart illustrating a flow of processing of a battery monitoring processing program executed by the chip internal controllers 114, 214, 314 of the battery monitoring chips 100, 200, 300. This program is pre-stored in a recording region of the chip internal controllers 114, 214, 314.

The microcomputer 500 generates a cell voltage detection instruction as an instruction to detect the voltage of the measurement target battery cell from out of the battery cells C1 to C9 configuring the battery 400, and transmits the generated cell voltage detection instruction to the battery monitoring chip 100. The cell voltage detection instruction is received by the chip internal controller 114 through the communication section 115 of the battery monitoring chip 100.

At step S1, the chip internal controllers 114, 214, 314 determine whether or not a cell voltage detection instruction generated by the microcomputer 500 has arrived. Processing transitions to step S2 when chip internal controllers 114, 214, 314 receive a cell voltage detection instruction.

At step S2, the chip internal controllers 114, 214, 314 determine whether or not the battery cell indicated by the received cell voltage detection instruction is one of its own battery cell monitoring targets.

When determined that the battery cell indicated by the received cell voltage detection instruction is one of its own battery cell monitoring targets, at step S3 the chip internal controllers 114, 214, 314 control the cell selection switch 111, 211 or 311 for extracting the positive electrode electrical potential and the negative electrode electrical potential of the battery cell indicated by the cell voltage detection instruction. The positive electrode electrical potential and the negative electrode electrical potential of the battery cell indicated by the cell voltage detection instruction from the cell selection switch 111, 211 or 311 is thereby output, a voltage that is the difference between the positive electrode electrical potential and the negative electrode electrical potential of the battery cell is output from the analogue level shifter 112, 212, or 312 as a voltage value from the relevant battery cell, and the voltage difference is converted into a digital signal and output by the A/D converter 113, 213 or 313.

At step S4, the chip internal controllers 114, 214, 314 output the digital signal output from the A/D converter at step S3 as a cell voltage measurement result from the communication terminals 141, 241, 341 through the communication sections 115, 215, 315, and the present routine is ended.

When determined that the battery cell indicated by the received cell voltage detection instruction is not one of its own battery cell monitoring targets, then at step S5 the chip internal controllers 114, 214 transfer the cell voltage detection instruction to the higher position battery monitoring chip.

At step S6, the chip internal controllers 114, 214 determine whether or not a cell voltage measurement result has been received from the higher position battery monitoring chip, and processing transitions to step S4 when determined that a cell voltage measurement result has been received. At step S4, the chip internal controllers 114, 214, 314 output a digital signal indicating the cell voltage received from the higher position battery monitoring chip as a cell voltage measurement result from the communication terminals 141, 241 through the communication sections 115, 215, and the present routine is ended.

Explanation follows regarding, as an example, battery monitoring processing in a case in which the battery cell C8 has been selected by the cell voltage detection instruction. The chip internal controller 114 of the battery monitoring chip 100 determines at step S2 that the battery cell C8 indicated by the cell voltage detection instruction, received from the microcomputer 500 through the communication section 115 at step S1, is not one of the battery cells C1 to C3 that are its own monitoring targets, and at step S5 transfers the cell voltage detection instruction to the higher position battery monitoring chip 200 through the communication section 116.

The chip internal controller 214 of the battery monitoring chip 200 determines at step S2 that the battery cell C8 indicated by the cell voltage detection instruction, received from the lower position battery monitoring chip 100 through the communication section 215 at step S1, is not one of the battery cells C4 to C6 that are its own monitoring targets, and at step S5 transfers the cell voltage detection instruction to the higher position battery monitoring chip 300 through the communication section 216.

The chip internal controller 314 of the battery monitoring chip 300 determines at step S2 that the battery cell C8 indicated by the cell voltage detection instruction, received from the lower position battery monitoring chip 200 through the communication section 315 at step S1, is one of the battery cells C7 to C9 that are its own monitoring targets, and at step S3 controls the cell selection switch 311 to measure the voltage of the battery cell C8. At step S4, the chip internal controller 314 outputs the measurement result of the cell voltage of the battery cell C8 to the communication terminal 341 through the communication section 315.

The cell voltage measurement result of the battery cell C8 output from the communication terminal 341 of the battery monitoring chip 300 is received at step S6 by the communication section 216 of the battery monitoring chip 200, and at step S4 is output via the chip internal controller 214 from the communication terminal 241 through the communication section 215. The cell voltage measurement result of the battery cell C8 output from the communication terminal 241 of the battery monitoring chip 200 is received at step S6 by the communication section 116 of the battery monitoring chip 100, and at step S4 is output via the chip internal controller 114 from the communication terminal 141 through the communication section 115. The cell voltage measurement result of the battery cell C8 output from the communication terminal 141 of the battery monitoring chip 100 is supplied to the microcomputer 500. The cell voltage measurement results of each of the battery cells C1 to C9 are accordingly detectable by the microcomputer 500.

Figure 3:
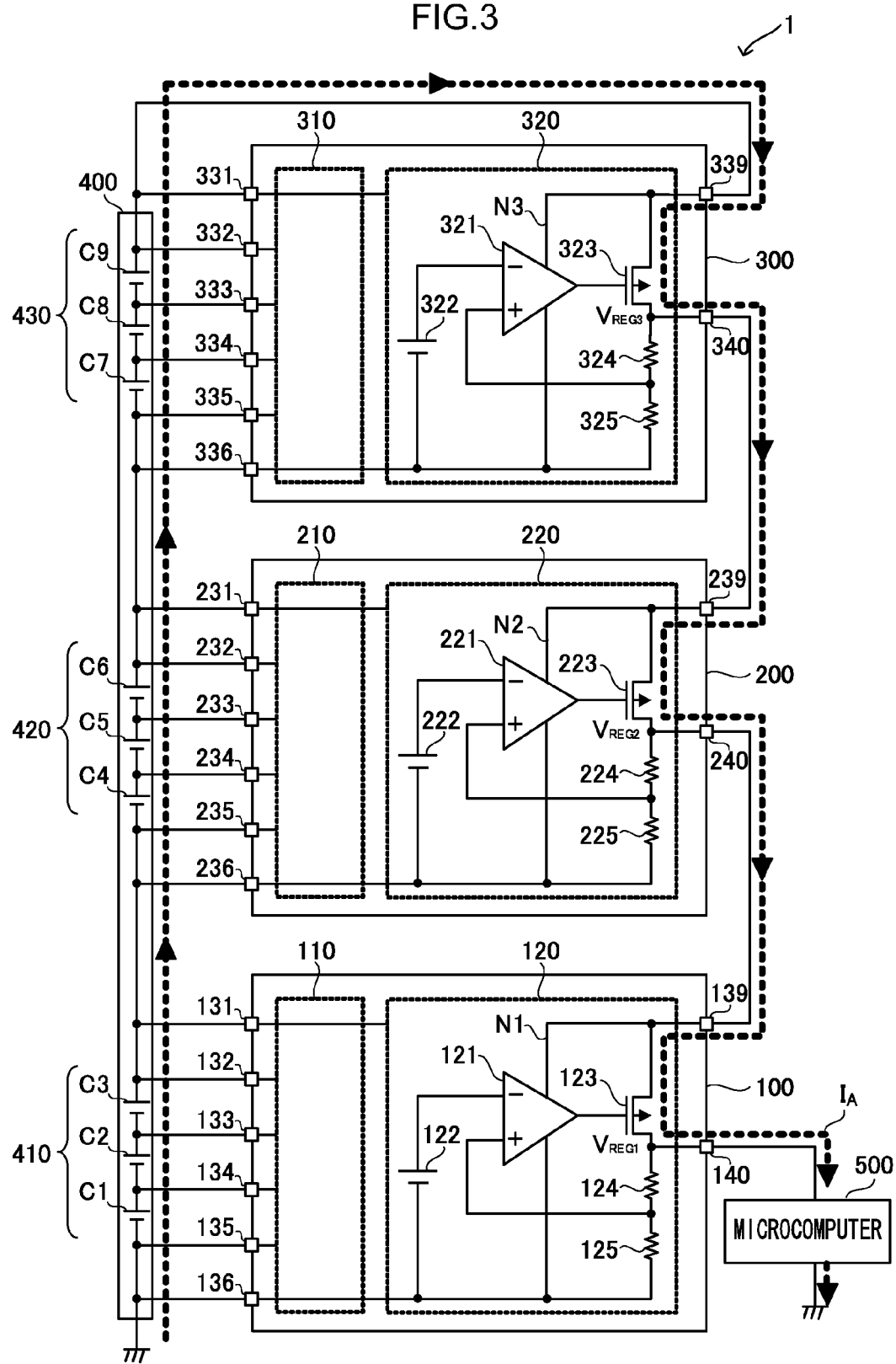
FIG. 3 is a configuration diagram of a battery monitoring system 1 illustrating a detailed configuration of a regulator according to an exemplary embodiment of the present invention.

FIG. 3 is a configuration diagram of the battery monitoring system 1 for illustrating detailed configuration of the regulators 120, 220, 320 of the battery monitoring chips 100, 200, 300. Note that the main purpose of FIG. 3 is to explain the configuration of the regulators 120, 220, 320 of the battery monitoring chips 100, 200, 300, and so configuration in the configuration illustrated in FIG. 1 that is not employed in explanation of the regulators 120, 220, 320 is omitted where appropriate.

The regulator 120 of the battery monitoring chip 100 is configured including an operational amplifier 121 and a reference voltage source 122, an output transistor 123, and resistance elements 124 and 125. The output transistor 123 is configured for example by a P channel MOSFET. The inverting input terminal of the operational amplifier 121 is connected to the reference voltage source 122, and the non-inverting input terminal thereof is connected to a connection point between the serially connected resistance elements 124 and 125. The gate of the output transistor 123 is connected to the output end of the operational amplifier 121. The source of the output transistor 123 and the power supply terminal of the operational amplifier 121 configuring a power supply node N1 are connected to the regulator power supply terminal 139. The drain of the output transistor 123 is connected to the regulator output terminal 140. The resistance elements 124 and 125 are connected in series between the drain of the output transistor 123 and the ground line connected to the ground terminal 136. The ground terminal of the operational amplifier 121 is also connected to the ground line.

The operational amplifier 121 is driven by the drive voltage $V_{REG2}$ generated by the regulator 220 of the higher position battery monitoring chip 200 input from the regulator power supply terminal 139, and generates a control signal for supply to the gate of the output transistor 123 such that the output voltage of the regulator 120 (drive voltage $V_{REG1}$) is a specific value. Based on the control signal input to the gate of the output transistor 123 output from the operational amplifier 121, the output transistor 123 generates its own drive voltage $V_{REG1}$ from the drive voltage $V_{REG2}$ generated by the regulator 220 of the higher position battery monitoring chip 200.

The regulator 220 of the battery monitoring chip 200 and the regulator 320 of the battery monitoring chip 300 have similar configurations to that of the regulator 120 of the battery monitoring chip 100. Thus duplicate explanation will be omitted regarding the regulators 220, 320.

The operational amplifier 221 of the regulator 220 is driven by the drive voltage $V_{REG3}$ generated by the regulator 320 of the higher position battery monitoring chip 300 input from the regulator power supply terminal 239, and generates a control signal for supply to the gate of the output transistor 223 such that the output voltage of the regulator 220 (drive voltage $V_{REG2}$) is a specific value. Based on the control signal output from the operational amplifier 221 and input to the gate of the output transistor 223, the output transistor 223 generates its own drive voltage $V_{REG2}$ from the drive voltage $V_{REG3}$ generated by the regulator 320 of the higher position battery monitoring chip 300.

The operational amplifier 321 of the regulator 320 is driven by the battery voltage output from the positive electrode side of the battery cell C9 of the battery 400 and input from the regulator power supply terminal 339, and generates a control signal for supply to the gate of the output transistor 323 such that the output voltage of the regulator 320 (drive voltage $V_{REG3}$) is a specific value. Based on the control signal output from the operational amplifier 321 and input to the gate of the output transistor 323, the output transistor 323 generates its own drive voltage $V_{REG3}$ from the above battery voltage.

The voltage per single battery cell of the battery 400 is controlled, for example, so as to be 4V. A voltage of 12V is supplied to the power supply terminal 131 of the battery monitoring chip 100 and the ground terminal 236 of the battery monitoring chip 200 from the battery 400. A voltage of 24V is supplied to the power supply terminal 231 of the battery monitoring chip 200 and the ground terminal 336 of the battery monitoring chip 300 from the battery 400. A voltage of 36V is supplied to the power supply terminal 331 of the battery monitoring chip 300 and the regulator power supply terminal 339 from the battery 400.

The regulators 120, 220, 320 generate respective drive voltages $V_{REG1}$, $V_{REG2}$, $V_{REG3}$ that, for example, each have voltage levels that are 5V higher than the voltages supplied to the ground terminals 136, 236, 336. Namely, the drive voltage $V_{REG1}$ generated by the regulator 120 is 5V, the drive voltage $V_{REG2}$ generated by the regulator 220 is 17V, and the drive voltage $V_{REG3}$ generated by the regulator 320 is 29V.

The regulator 320 of the battery monitoring chip 300 receives as its own drive voltage the voltage of the positive electrode side of the battery cell C9 input from the regulator power supply terminal 339 (36V), and generates the drive voltage $V_{REG3}$ (29V). The regulator 320 supplies the generated drive voltage $V_{REG3}$ (29V) to a specific circuit of a battery monitoring function section 310, and also outputs the drive voltage $V_{REG3}$ from the regulator output terminal 340 to supply the lower position battery monitoring chip 200.

The regulator 220 of the battery monitoring chip 200 receives as its own drive voltage the drive voltage $V_{REG3}$ (29V) generated by the regulator 320 of the higher position battery monitoring chip 300 and input from the regulator power supply terminal 239, and generates the drive voltage $V_{REG2}$ (17V). The regulator 220 supplies the generated drive voltage $V_{REG2}$ (17V) to a specific circuit of a battery monitoring function section 210, and also outputs the drive voltage $V_{REG2}$ from the regulator output terminal 240 to supply the lower position battery monitoring chip 100.

The regulator 120 of the battery monitoring chip 100 receives as its own drive voltage the drive voltage $V_{REG2}$ (17V) generated by the regulator 220 of the higher position battery monitoring chip 200 and input from the regulator power supply terminal 139, and generates the drive voltage $V_{REG1}$ (5V). The regulator 120 supplies the generated drive voltage $V_{REG1}$ (5V) to a specific circuit of a battery monitoring function section 110, and also outputs the drive voltage $V_{REG1}$ from the regulator output terminal 140 to supply the microcomputer 500. The microcomputer 500 operates with the drive voltage $V_{REG1}$ generated by the regulator 120 of the battery monitoring chip 100 as the drive voltage (power supply voltage).

In FIG. 3, the path of drive current $I_A$ supplied to the microcomputer 500 is depicted with intermittent-line arrows. As illustrated in FIG. 3, the drive current $I_A$ is supplied to the microcomputer 500 via the battery cell groups 410, 420, 430, and the regulators 320, 220, 120. The drive current $I_A$ supplied to the microcomputer 500 accordingly flows through all the battery cell groups 410, 420, 430 configuring the battery 400. Thus in a configuration in which power is supplied to the microcomputer 500 through the single battery monitoring chip 100 configuring the battery monitoring system 1, the power is uniformly consumed by each of the battery cell groups 410, 420, 430 configuring the battery 400.

Figure 4:
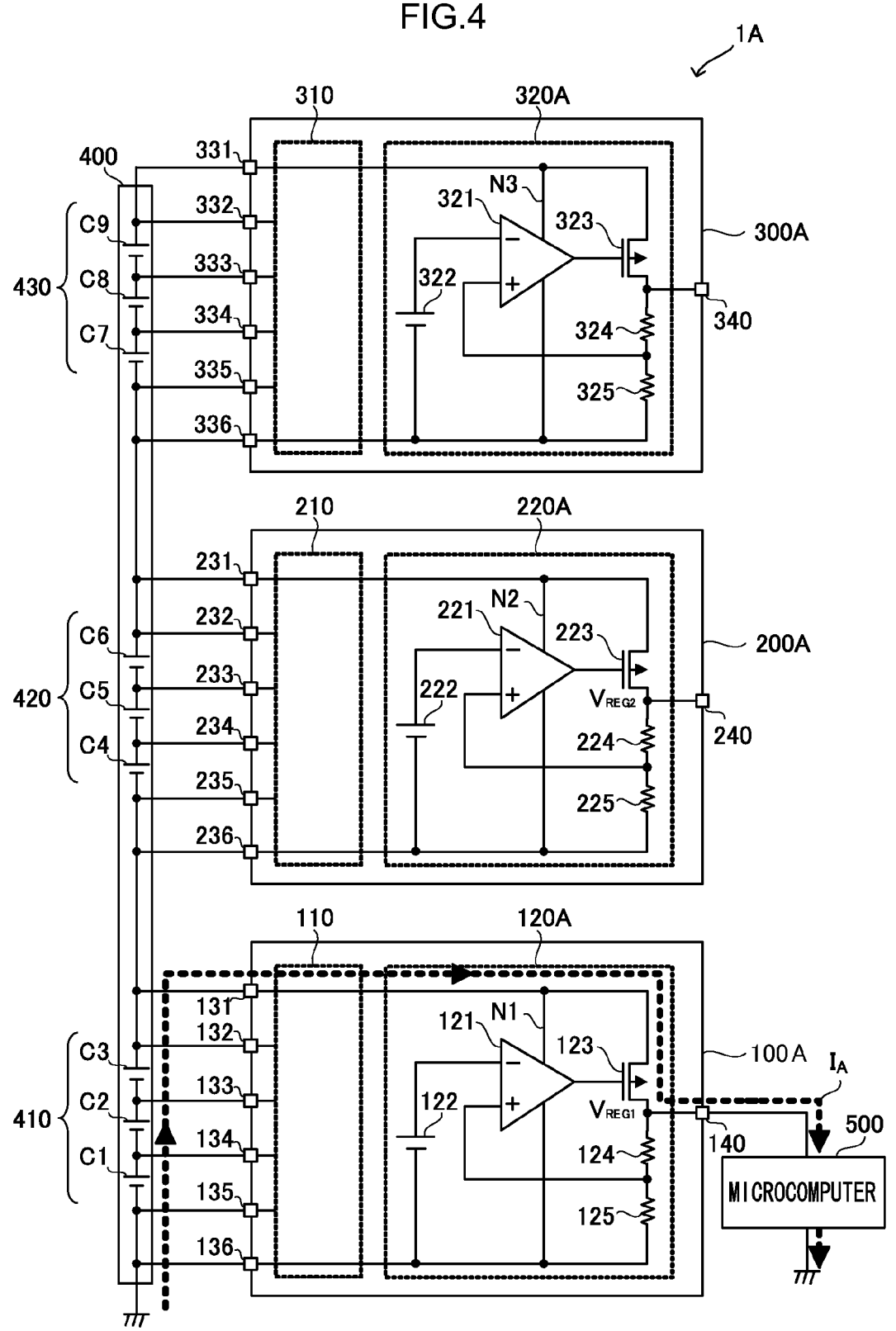
FIG. 4 is a configuration diagram of a battery monitoring system according to a Comparative Example.

FIG. 4 is a configuration diagram of a battery monitoring system 1A according to a Comparative Example. The configuration elements in FIG. 4 the same as those of the battery monitoring system 1 according to the exemplary embodiment of the present invention described above are appended with the same reference numerals, and duplicate explanation will be omitted thereof.

In the battery monitoring system 1A according to the Comparative Example, battery monitoring chips 100A, 200A, 300A do not have regulator power supply terminals (terminals corresponding to the regulator power supply terminals 139, 239, 339 according to the exemplary embodiment of the present invention). The regulator power supply terminal is a terminal for receiving supply of drive voltage from the regulator of the higher position battery monitoring chip. In the battery monitoring chip 100A according to the Comparative Example, a power supply terminal of an operational amplifier 121 and the source of an output transistor 123 that form a power supply node N1 of a regulator 120A are connected to a power supply terminal 131 of the battery monitoring chip 100A. Similarly, in the battery monitoring chip 200A according to the Comparative Example, a power supply terminal of an operational amplifier 221 and the source of an output transistor 223 that form a power supply node N2 of a regulator 220A are connected to a power supply terminal 231 of the battery monitoring chip 200A. Similarly, in the battery monitoring chip 300A according to the Comparative Example, a power supply terminal of an operational amplifier 321 and the source of an output transistor 323 that form a power supply node N3 of a regulator 320A are connected to a power supply terminal 331 of the battery monitoring chip 300A. A microcomputer 500 is connected to a regulator output terminal 140 of the battery monitoring chip 100A. Thus in the battery monitoring system 1A according to the Comparative Example, the drive voltage for driving each of the regulators 120A, 220A is received supplied from respective battery cell group 410, 420 subject to measurement by the battery monitoring chip formed by the regulators 120A, 220A themselves, rather than being received supplied from a regulator formed within the higher position battery monitoring chip than the battery monitoring chip formed by the regulators 120A, 220A themselves.

In FIG. 4, the path of drive current $I_A$ supplied to the microcomputer 500 is depicted with intermittent-line arrows. In the battery monitoring system 1A according to the Comparative Example, as described above, the drive voltage for driving each of the regulators 120A, 220A is received supplied from the respective battery cell group 410, 420 subject to measurement by the battery monitoring chip formed by the regulators 120A, 220A themselves, rather than being received supplied from a regulator formed within the higher position battery monitoring chip than the battery monitoring chip formed by the regulators 120A, 220A themselves. Thus the drive current $I_A$ is supplied to the microcomputer 500 via the battery cell group 410 connected to the microcomputer 500 and subject to measurement by the battery monitoring chip 100A and by the regulator 120A of the battery monitoring chip 100A. Namely, the drive current $I_A$ supplied to the microcomputer 500 only flows through the battery cell group 410 from out of the battery cell groups 410, 420, 430 configuring the battery 400. Consequently, the battery monitoring system 1A according to the Comparative Example has a larger power consumption amount in the battery cell group 410 than in the battery cell groups 420 and 430. There is accordingly a need to make the charge amount in each of the battery cell groups uniform by regularly charging only the battery cell group 410 alone, or discharging only the battery cell groups 420 and 430.

In contrast thereto, in the battery monitoring system 1 according to the exemplary embodiment of the present invention, in each of the battery monitoring chips 200, 100 other than the highest position battery monitoring chip 300, the regulator power supply terminals 139, 239 are connected to the regulator output terminals 240, 340 of the respective higher position battery monitoring chips 200, 300. Namely, the output transistors 123, 223, 323 of each of the regulators are connected together in series. The drive current $I_A$ supplied to the microcomputer 500 through the battery monitoring chip 100 accordingly flows through all the battery cell groups 410, 420, 430 configuring the battery 400, and so power is consumed uniformly in each of the battery cell groups 410, 420, 430. Namely, the microcomputer 500 is driven by the drive voltage $V_{REG1}$ generated by the regulator 120 of the battery monitoring chip 100 as power is consumed by the battery cells C1 to C9 configuring the battery 400.

In the battery monitoring system according to the Comparative Example, in cases where variation arises in the power consumption amount of each of the battery cell groups, the charging is performed to the battery to fully charge the battery cell group where there is significant power consumption, and the other battery cell groups become overcharged, thereby risking shortening the life of the battery. The control required for discharge processing from the other battery cell groups that have been overcharged is also complicated. In contrast thereto, in the battery monitoring system 1 according to the present exemplary embodiment, power is consumed uniformly in each of the battery cell groups 410, 420, 430, enabling variation in the voltage values to be suppressed from occurring between the battery cell groups. This thereby enables circumstances such as described in the Comparative Example in which some of the battery cell groups become overcharged, and there is a need to discharge from some of the battery cell groups, to be avoided.

The battery monitoring system 1 according to the exemplary embodiment of the present invention is a configuration in which drive voltage for driving the microcomputer 500 is supplied from the single battery monitoring chip 100. This thereby eliminates the need to provide a separate regulator to generate the drive voltage of the microcomputer 500, enabling the number of components to be reduced and the system to be made more compact. According to such a configuration, the communication section 115 performing communication with the microcomputer 500, and the microcomputer 500, are driven by a drive voltage $V_{REG1}$ generated by the same regulator 120. This means that misalignment in the logic levels of signals transmitted and received between the communication section 115 and the microcomputer 500 is eliminated, enabling data transfer between the communication section 115 and the microcomputer 500 without inconsistencies arising.

In the battery monitoring system 1 according to the exemplary embodiment, the drive voltage $V_{REG2}$ (17V) generated by the regulator 220 of the higher position battery monitoring chip 200 is applied between the source and the drain of the output transistor 123 of the regulator 120 of the battery monitoring chip 100. The drive voltage $V_{REG2}$ is higher than the power supply voltage (each 12V) applied between the source and the drain of the output transistor 123A of the regulator 120A from the power supply terminal 131 of the battery monitoring chip 100A in the battery monitoring system 1A according to the Comparative Example. The withstand voltage between the source and the drain of the output transistor 123 configuring the regulator 120 accordingly needs to be higher than the withstand voltage between the source and the drain of the output transistor 123A of the regulator 120A of the battery monitoring system 1A according to the Comparative Example. Thus the output transistor 123 of the regulator 120 is preferably configured such that the withstand voltage between the source and the drain of output transistor 123 itself is higher than the withstand voltages of the transistors employed in the cell selection switch 111, the analogue level shifter 112, the A/D converter 113, the chip internal controller 114, and the communication section 115 in the battery monitoring function section 110. In other words, the transistors employed in the cell selection switch 111, the analogue level shifter 112, the A/D converter 113, the chip internal controller 114, and the communication section 115 in the battery monitoring function section 110 are preferably formed so as to have a lower withstand voltage between the source and the drain of the transistor itself than the withstand voltage between the source and the drain of the output transistor 123. Forming the transistors employed in the cell selection switch 111, the analogue level shifter 112, the A/D converter 113, the chip internal controller 114, and the communication section 115 in the battery monitoring function section 110 so as to have a withstand voltage between their own sources and drains that is lower than the withstand voltage of the output transistor 123 has the following advantage. It means that, even in cases in which the withstand voltage between the source and the drain of the output transistor 123 of the regulator 120 of the battery monitoring system 1 according to the exemplary embodiment of the present invention is higher than the withstand voltage between the source and the drain of the output transistor 123A of the regulator 120A of the battery monitoring system 1A according to the Comparative Example, and the device surface area of the output transistor 123 is larger than the device surface area of the output transistor 123A, the need for a wasteful increase in the device surface area in the battery monitoring function section 110 for the transistors employed in the cell selection switch 111, the analogue level shifter 112, the A/D converter 113, the chip internal controller 114, and the communication section 115, to accompany the increase in the device surface area of the output transistor 123, is eliminated. Being able to suppress an increase in the device surface area of each of the transistors employed in each of the above configuration circuits in the battery monitoring function section 110, accordingly enables an increase in the surface area of the battery monitoring chip 100 overall to be suppressed.

Similarly, the output transistor 223 of the regulator 220 is preferably configured such that the withstand voltage between the source and the drain of output transistor 223 itself is higher than the withstand voltages of the transistors employed in the cell selection switch 211, the analogue level shifter 212, the A/D converter 213, the chip internal controller 214, and the communication section 215 in the battery monitoring function section 210. In other words, the transistors employed in the cell selection switch 211, the analogue level shifter 212, the A/D converter 213, the chip internal controller 214, and the communication section 215 in the battery monitoring function section 210 are preferably formed so as to have a lower withstand voltage between the source and the drain of the transistor itself than the withstand voltage between the source and the drain of the output transistor 223.

Similarly, the output transistor 323 of the regulator 320 is preferably configured such that the withstand voltage between the source and the drain of output transistor 323 itself is higher than the withstand voltages of the transistors employed in the cell selection switch 311, the analogue level shifter 312, the A/D converter 313, the chip internal controller 314, and the communication section 315 in the battery monitoring function section 310. In other words, the transistors employed in the cell selection switch 311, the analogue level shifter 312, the A/D converter 313, the chip internal controller 314, and the communication section 315 in the battery monitoring function section 310 are preferably formed so as to have a lower withstand voltage between the source and the drain of the transistor itself than the withstand voltage between the source and the drain of the output transistor 323.

However, in order to simplify the fabrication process, the transistors 123, 223, 323 may be produced with the same withstand voltage as the withstand voltage of the transistors employed in the cell selection switch 211, the analogue level shifter 212, the A/D converter 213, the chip internal controller 214, and the communication section 215, but there is no limitation thereto.

Figure 5:
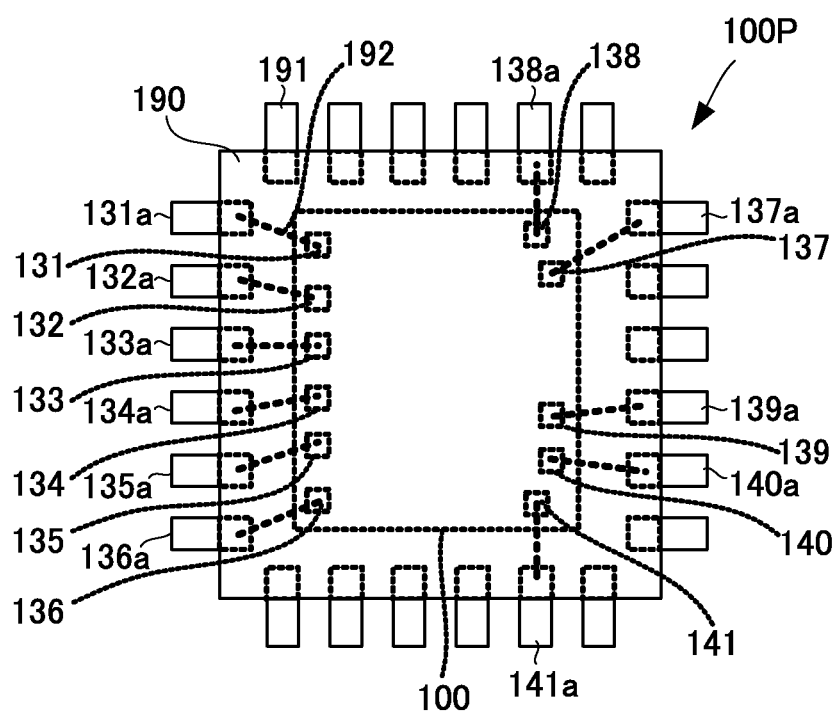
FIG. 5 is a plan view illustrating a configuration of a semiconductor package housing a battery monitoring chip.

In the present exemplary embodiment, the battery monitoring chips 100, 200, 300 are housed in semiconductor packages. FIG. 5 is a diagram illustrating a configuration of a semiconductor package 100P housing the battery monitoring chip 100. The battery monitoring chip 100 is configured by a semiconductor chip with a semiconductor substrate such as one manufactured from silicon as the base. Each of the terminals 131 to 141 of the battery monitoring chip 100 is configured as an electrode pad formed on the surface of the semiconductor chip. The placement illustrated in FIG. 5 is of a single row of the terminals 131 to 141 configured as electrode pads on the chip is merely one example. The placement of each of the terminals 131 to 141 on the chip may be suitably modified according to the layout of each of the circuits configuring the battery monitoring chip 100 and the like. The semiconductor package 100P has, for example, a quad flat package (QFP) form, with a rectangular shaped sealing portion 190 sealing the battery monitoring chip 100, and plural lead terminals 191 arrayed along the four sides of the sealing portion 190. The respective terminals 131 to 141 of the battery monitoring chip 100 and the lead terminals 191 are connected together electrically by bonding wires 192, and external terminals 131a to 141a are formed to correspond to each of the terminals 131 to 141 of the battery monitoring chip 100.

Semiconductor packages 200P and 300P housing the battery monitoring chips 200 and 300 (see FIG. 6) have a similar configuration to that of the semiconductor package 100P illustrated in FIG. 5. The microcomputer 500 is also configured by a semiconductor chip with a semiconductor substrate as the base, housed in a semiconductor package 500P (see FIG. 6). In the present exemplary embodiment, the semiconductor packages respectively housing the battery monitoring chips 100, 200, 300 are QFP type packages, however the type of semiconductor packages housing the battery monitoring chips 100, 200, 300 may be chip sized packages (CSP). CSPs are packages having external dimensions close to the chip size itself, with a terminal structure of solder balls disposed on a mounting face. In cases in which the semiconductor packages housing the battery monitoring chips 100, 200, 300 are CSPs, the terminals 131 to 141 etc. provided to each of the battery monitoring chips may be configured so as to be electrically connected to each of the solder balls as plural external terminals connecting the semiconductor package to external electrical potentials.

Figure 6:
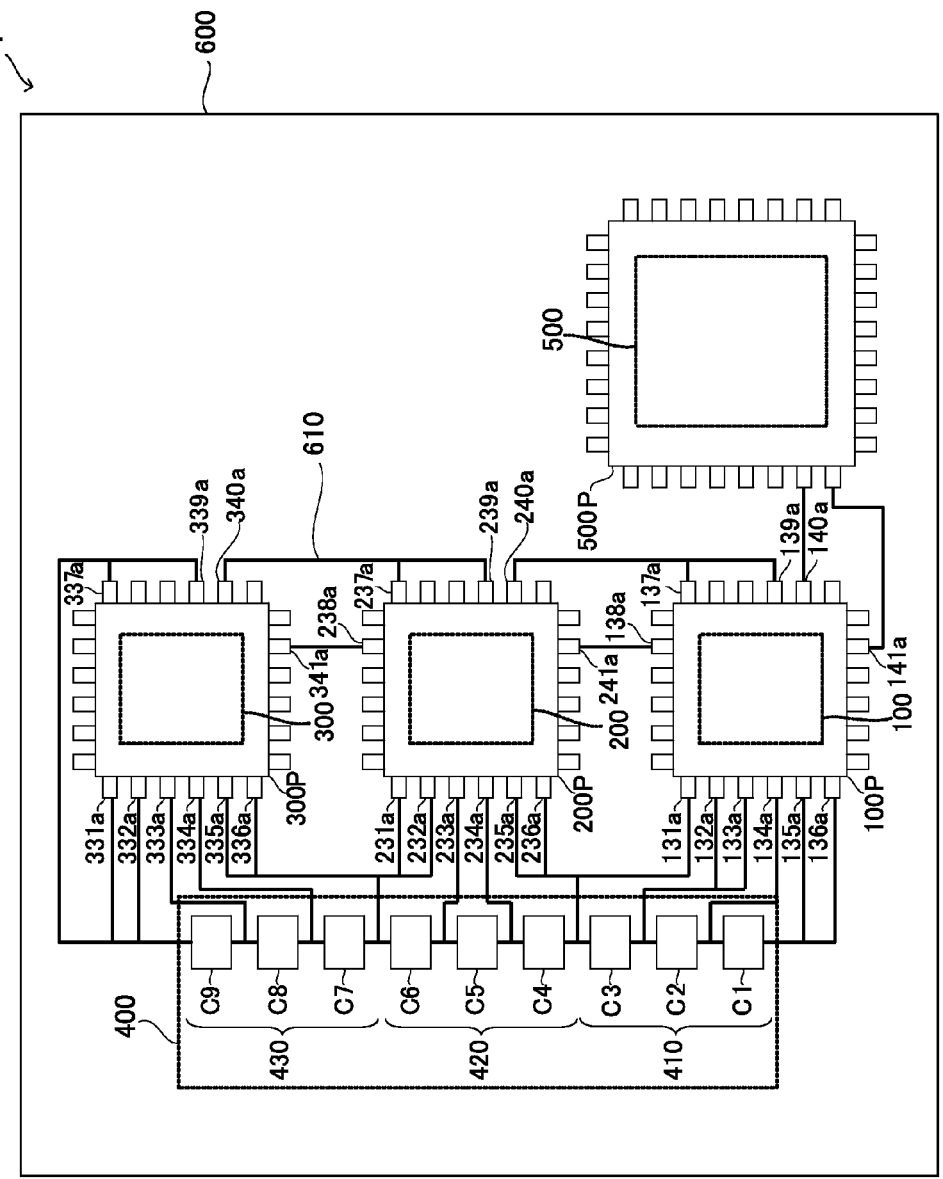
FIG. 6 is a diagram illustrating an example of a mounting layout on a wiring board of each configuration component of a battery monitoring system according to an exemplary embodiment of the present invention.

FIG. 6 is a diagram illustrating an example of an exemplary embodiment in which each of the components of the battery monitoring system 1 are in a mounted state onto a wiring board. A wiring board 600 is mounted with the semiconductor packages 100P, 200P, 300P respectively housing the battery monitoring chips 100, 200, 300, and the semiconductor package 500P housing the microcomputer 500. The battery 400 that is the monitoring target of the battery monitoring system 1 is also mounted on the wiring board 600. Plural wiring lines 610 for electrically connecting the above mounted components together are also formed on the wiring board 600.

Second Exemplary Embodiment

Figure 7:
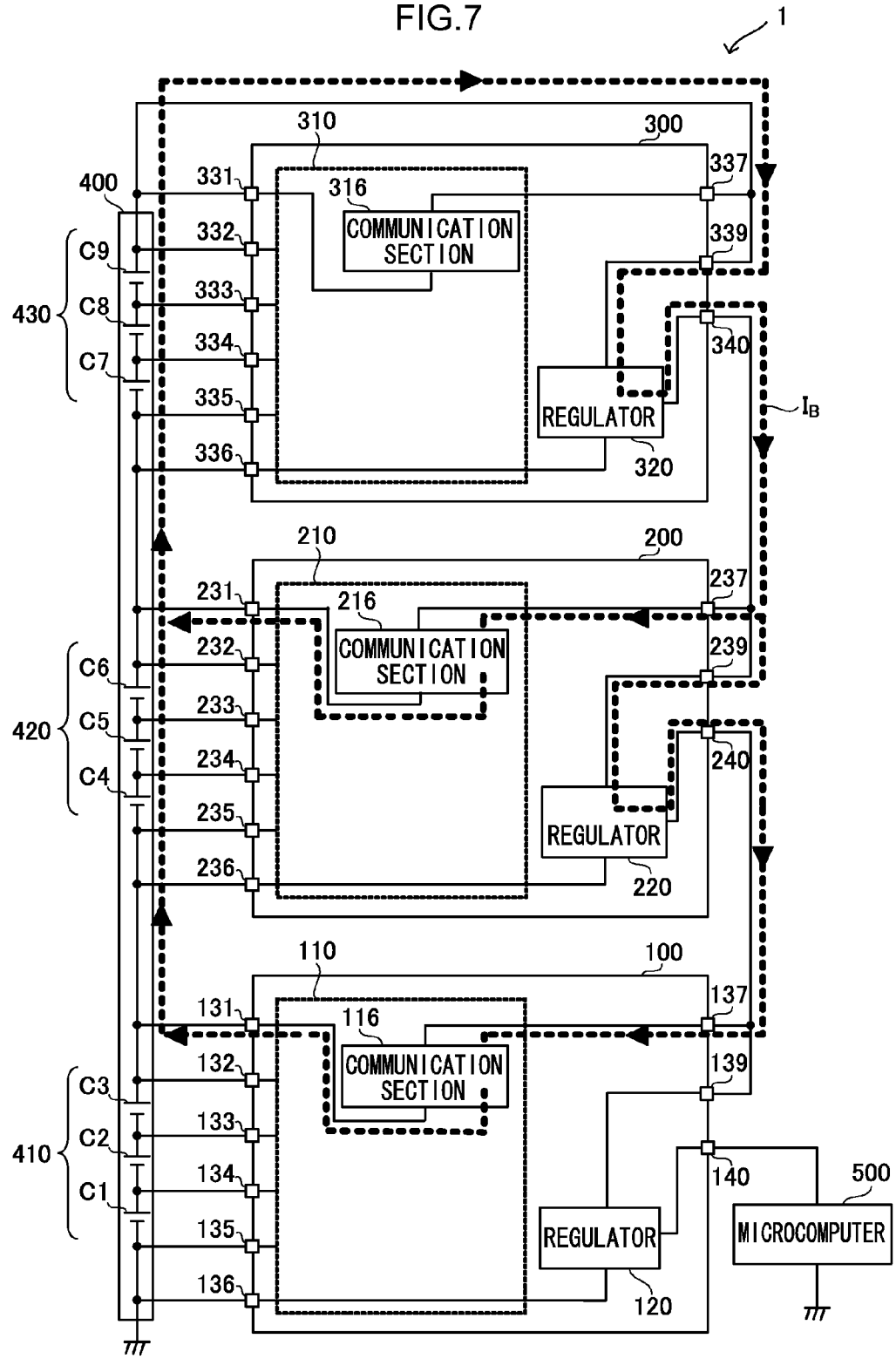
FIG. 7 is a configuration diagram of a battery monitoring system depicting wiring of power source lines and ground lines of a communication section according to an exemplary embodiment of the present invention.

FIG. 7 is a configuration diagram of a battery monitoring system 1 according to the first exemplary embodiment in which the wiring of the power source lines and ground lines of the communication sections 116, 216, 316 are clearly illustrated. The path of drive current $I_B$ supplied to the communication sections 116, 216 is shown in FIG. 7 by the intermittent-line arrows. Configuration not required for the purposes of explanation is omitted from FIG. 7 as appropriate. The configuration elements in FIG. 7 appended with the same reference numerals to those of FIG. 1 etc. are the same thereas, and duplicate explanation will be omitted thereof.

The power supply node of the communication section 116 of the battery monitoring chip 100 is connected to the communication power supply terminal 137, and the communication power supply terminal 137 is connected to the regulator output terminal 240 of the higher position battery monitoring chip 200. The ground node of the communication section 116 of the battery monitoring chip 100 is connected to the power supply terminal 131.

Similarly, the power supply node of the communication section 216 of the battery monitoring chip 200 is connected to the communication power supply terminal 237, and the communication power supply terminal 237 is connected to the regulator output terminal 340 of the higher position battery monitoring chip 300. The ground node of the communication section 216 of the battery monitoring chip 200 is connected to the power supply terminal 231.

The power supply node of the communication section 316 of the battery monitoring chip 300 is connected to the communication power supply terminal 337, and the communication power supply terminal 337 is connected to the positive electrode of the battery cell C9 (the power supply terminal 331). The ground node of the communication section 316 of the battery monitoring chip 300 is connected to the power supply terminal 331. Namely, the communication section 316 of the highest position battery monitoring chip 300 has the same electrical potential as the power supply node and the ground node, so as not to operate. Thus in the highest position battery monitoring chip 300, functioning of the communication section 316 is stopped since there is no battery monitoring chip at a higher position than the battery monitoring chip 300, and hence there is no communication performed with a higher position battery monitoring chip.

The drive current $I_B$ supplied to the communication section 116 of the battery monitoring chip 100 flows in a path through the battery cell groups 420, 430, the regulator 320 of the battery monitoring chip 300, the regulator 220 of the battery monitoring chip 200, and the communication power supply terminal 137, the communication section 116, and the power supply terminal 131 of the battery monitoring chip 100. The drive current $I_B$ supplied to the communication section 216 of the battery monitoring chip 200 flows along a path through the battery cell group 430, the regulator 320 of the battery monitoring chip 300, and the communication power supply terminal 237, the communication section 216, and the terminal 231 of the battery monitoring chip 200. However, in the communication section 316 of the battery monitoring chip 300, the power supply node and the ground node are at the same electrical potential as each other, as described above, and so the drive current $I_B$ does not flow in the communication section 316.

As explained above, in the battery monitoring system 1 according to the first exemplary embodiment, the drive current $I_B$ supplied to the communication sections 116 and 216 does not flow in the battery cell group 410. Consequently, in the battery monitoring system 1 according to the first exemplary embodiment, the power consumption amount in the battery cell group 410 is smaller than in the battery cell groups 420 and 430. This therefore leads to variation according between the voltage value of the battery cell group 410, and the voltage value of the battery cell groups 420 and 430. However, whereas the drive current $I_A$ flowing in the microcomputer 500 is of the order of several mA to several tens of mA, the drive current $I_B$ flowing in the communication sections 116, 216 is of the order of several tens of μA to several hundreds of μA. Thus it can be stated that the degree of variation in the power consumption amount between the battery cell groups is much smaller in the battery monitoring system 1 according to the first exemplary embodiment than in the battery monitoring system 1A according to the Comparative Example illustrated in FIG. 6. However, since it is conceivable that such variation builds up with use over a prolonged period of time, preferably an adjustment unit is provided to make the power consumption amounts of the battery cell groups the same as each other.

Figure 8:
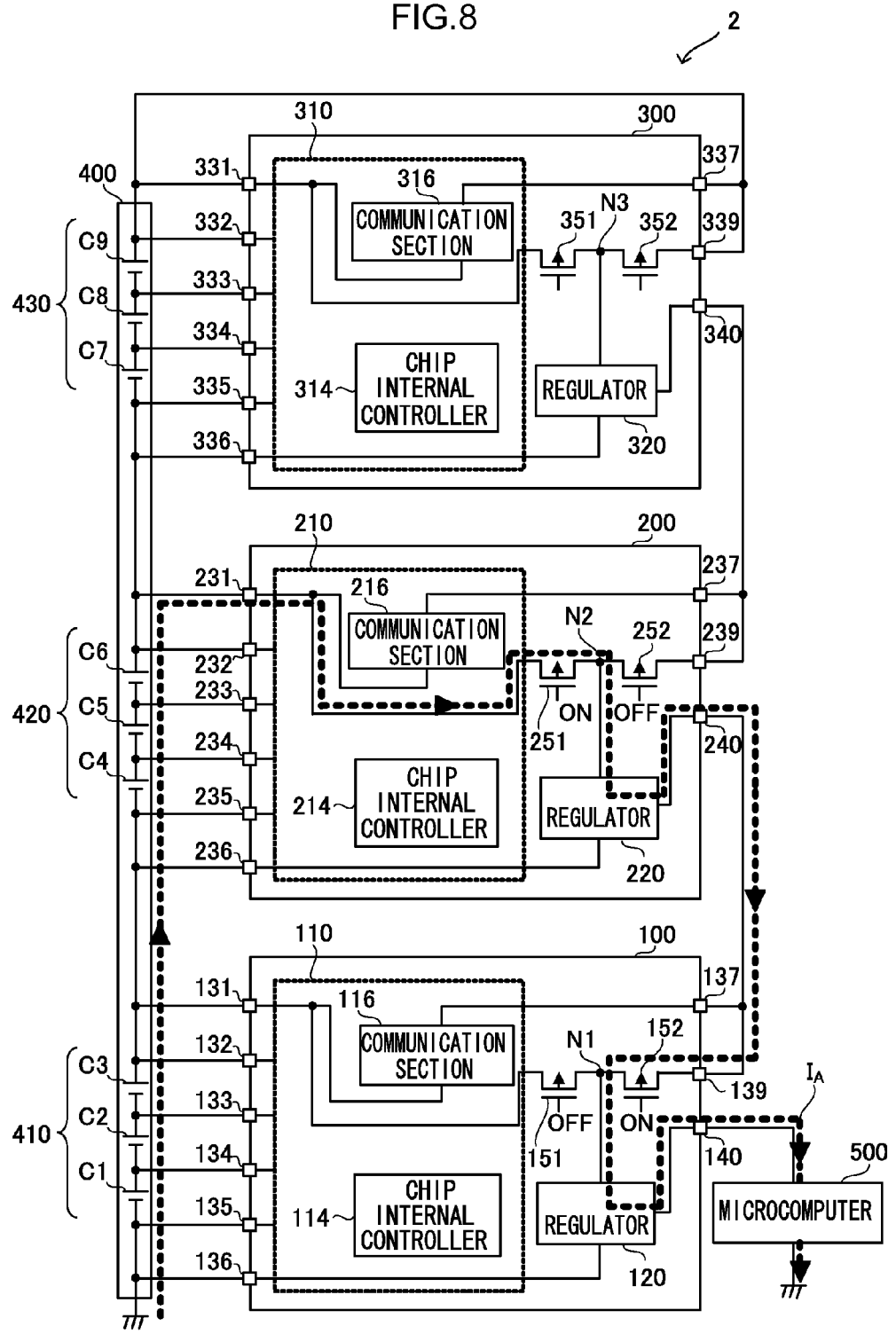
FIG. 8 is a configuration diagram of a battery monitoring system according to an exemplary embodiment of the present invention.

FIG. 8 is a configuration diagram of a battery monitoring system 2 according to a second exemplary embodiment of the present invention. Configuration elements the same as those of the battery monitoring system 1 according to the first exemplary embodiment are appended with the same reference numerals, and duplicate explanation will be omitted thereof.

In the battery monitoring system 2, a switch device 151 is provided between a power supply node N1 and a power supply terminal 131 of a regulator 120 of a battery monitoring chip 100. A switch device 152 is provided between the power supply node N1 of the regulator 120 and a regulator power supply terminal 139. In the ON state the switch device 151 connects the power supply node N1 of the regulator 120 to the power supply terminal 131 (the positive electrode of a battery cell C3). In the ON state the switch device 152 connects the power supply node N1 of the regulator 120 to the regulator power supply terminal 139 (the regulator output of a battery monitoring chip 200). The power supply node N1 is a node that is connected to the source of an output transistor 123 of the regulator 120 and the power supply terminal of an operational amplifier 121 (see FIG. 5). The switch devices 151, 152 are, for example, each configured by a P channel MOSFET, and are ON/OFF controlled by a gate signal supplied from a chip internal controller 114.

Similarly, a switch device 251 is provided between a power supply node N2 of a regulator 220 of the battery monitoring chip 200 and a power supply terminal 231, and a switch device 252 is provided between the power supply node N2 of the regulator 220 and a regulator power supply terminal 239. In the ON state the switch device 251 connects the power supply node N2 of the regulator 220 to the power supply terminal 231 (the positive electrode of a battery cell C6). In the ON state the switch device 252 connects the power supply node N2 of the regulator 220 to the regulator power supply terminal 239 (the regulator output of a battery monitoring chip 300). The power supply node N2 is a node that is connected to the source of an output transistor 223 of the regulator 220 and the power supply terminal of an operational amplifier 221 (see FIG. 5). The switch devices 251, 252 are, for example, each configured by a P channel MOSFET, and are ON/OFF controlled by a gate signal supplied from a chip internal controller 214.

Similarly, a switch device 351 is provided between a power supply node N3 of a regulator 320 of the battery monitoring chip 300 and a power supply terminal 331, and a switch device 352 is provided between the power supply node N3 of the regulator 320 and a regulator power supply terminal 339. In the ON state the switch device 351 connects the power supply node N3 of the regulator 320 to the power supply terminal 331 (the positive electrode of a battery cell C9). In the ON state the switch device 352 connects the power supply node N3 of the regulator 320 to the regulator power supply terminal 339. The power supply node N3 is a node that is connected to the source of an output transistor 323 of the regulator 320 and the power supply terminal of an operational amplifier 321 (see FIG. 5). The switch devices 351, 352 are, for example, each configured by a P channel MOSFET, and are ON/OFF controlled by a gate signal supplied from a chip internal controller 314.

FIG. 8 illustrates an example in which the path of a drive current $I_A$ supplied to a microcomputer 500 is that depicted by the intermittent-line arrows when the switch device 151 of the battery monitoring chip 100 is in an OFF state, the switch device 152 is in an ON state, the switch device 251 of the battery monitoring chip 200 is in an ON state, and the switch device 252 is in an OFF state. As a result of ON/OFF control of each of the switch devices as described above, the drive current $I_A$ passes through battery cell groups 410, 420, the switch device 251, the regulator 220, the switch device 152, and the regulator 120, and flows in the microcomputer 500. Namely, the drive current $I_A$ supplied to the microcomputer 500 does not flow in a battery cell group 430, suppressing the power consumption amount in the battery cell group 430. This thereby enables variation in the power consumption amounts between the battery cell groups accompanying the supply of the drive current $I_B$ to communication sections 116, 216 to be eliminated. Namely, when, due to continuous use, the amount of fall in the voltage accompanying power consumption in the battery cell group 430 has become larger than the fall in the voltage accompanying power consumption in the battery cell groups 420, 410 by a specific value or greater, and when variation in voltage values between battery cell groups has become significant, then as illustrated in FIG. 8, power consumption of the battery cell group 430 is suppressed by controlling the switch devices 151, 152, 251, 252. This thereby enables variation in voltage values, accompanying variation in the power consumption amounts between battery cell groups, to be eliminated.

Figure 9:
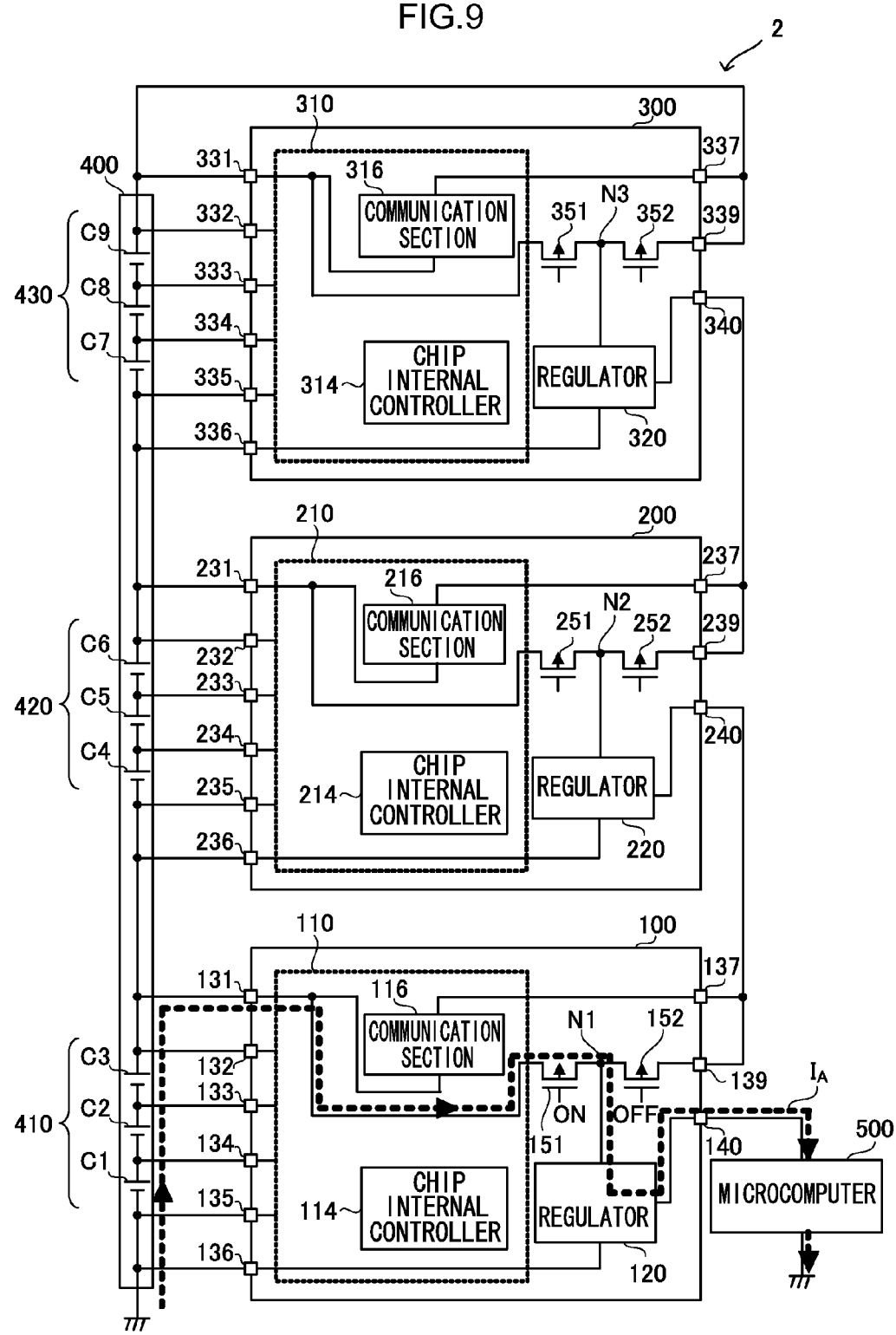
FIG. 9 is a configuration diagram of a battery monitoring system according to an exemplary embodiment of the present invention.

FIG. 9 illustrates, as another example, a case in which the path of a drive current $I_A$ supplied to the microcomputer 500 is that depicted by the intermittent-line arrows when the switch device 151 of the battery monitoring chip 100 is in an ON state and the switch device 152 is in an OFF state. As a result of ON/OFF control of each of the switch devices as described above, the drive current $I_A$ passes through the battery cell group 410, the switch device 151 and the regulator 120, and flows in the microcomputer 500. Namely, the drive current $I_A$ supplied to the microcomputer 500 does not flow in the battery cell groups 420, 430, suppressing the power consumption amount in the battery cell groups 420, 430. This thereby enables variation in the power consumption amounts between the battery cell groups accompanying the supply of the drive current $I_B$ to the communication sections 116, 216 to be eliminated. Namely, when, due to continuous use, the amount of power consumption in the battery cell groups 430, 420 has become significantly larger than the amount of power consumption in the battery cell group 410, then, as illustrated in FIG. 9, power consumption of the battery cell groups 430, 430 is suppressed by controlling the switch devices 151, 152. This thereby enables variation in the power consumption amounts between the battery cell groups to be eliminated.

Figure 10:
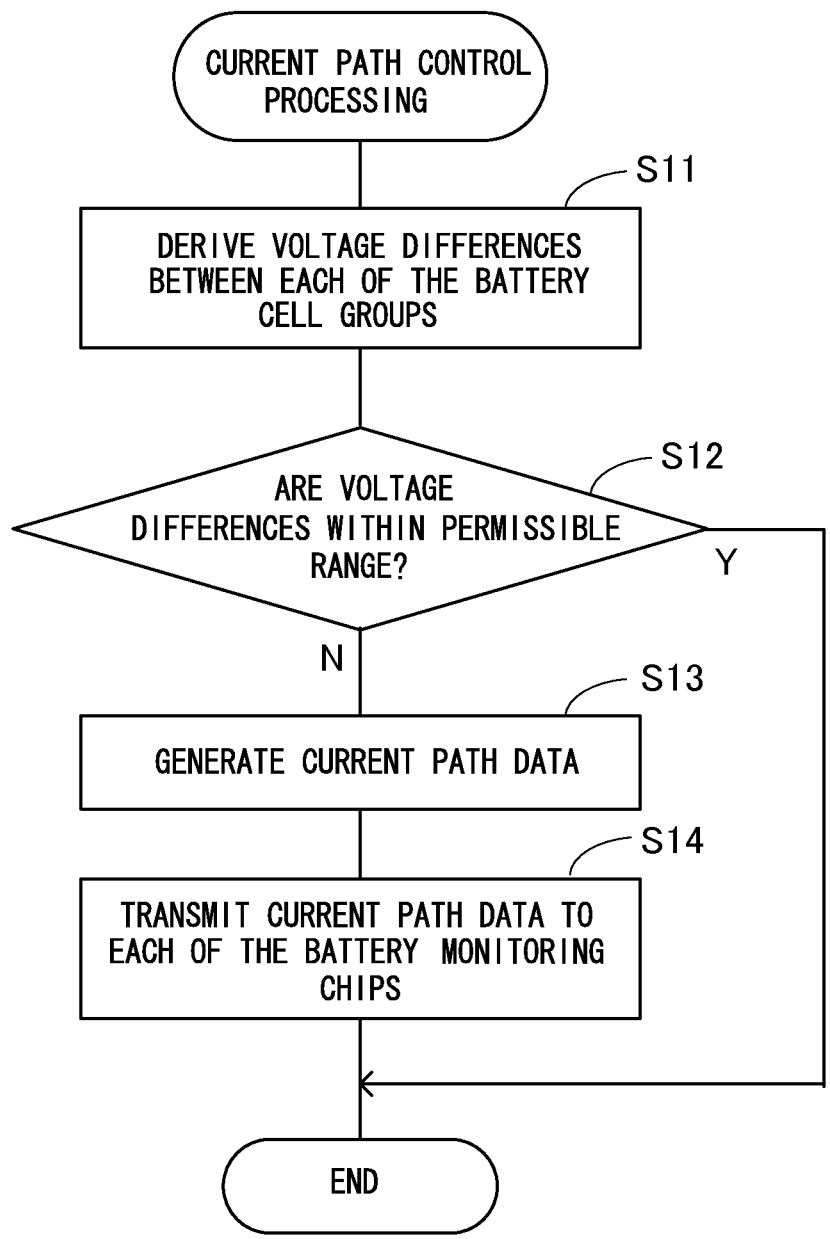
FIG. 10 is a flowchart illustrating a flow of processing in a current path control program according to an exemplary embodiment of the present invention.

FIG. 10 is a flowchart illustrating the flow of processing in a current path control program for controlling the path of the drive current $I_A$ of the microcomputer 500 to eliminate variation in power consumption amounts between the battery cell groups as described above. The program is a program executed by the microcomputer 500, and is pre-stored in a storage region of the microcomputer 500.

At step S11, the microcomputer 500 derives any voltage difference between each of the battery cell groups 410, 420, 430 based on measurement results of the voltages of the battery cells C1 to C9 notified from each of the battery monitoring chips 100, 200, 300. Namely, the microcomputer 500 derives the voltage of the battery cell group 410 as the sum of the cell voltages of the battery cells C1 to C3, derives the voltage of the battery cell group 420 as the sum of the cell voltages of the battery cells C4 to C6, and derives the voltage of the battery cell group 430 as the sum of the cell voltages of the battery cells C7 to C9. Then the microcomputer 500 derives any voltage differences between the battery cell groups 410, 420, 430 based on each of the derived voltages of the battery cell groups 410, 420, 430. Any voltage differences between the battery cell groups are an indicator of the degree of variation in the power consumption amounts between each of the battery cell groups.

At step S12, the microcomputer 500 determines whether or not voltage differences derived at step S11 between each of the battery cell groups 410, 420, 430 are within a permissible range. The microcomputer 500 ends the present routine when determined that the voltage differences between each of the battery cell groups 410, 420, 430 are within a permissible range, and processing proceeds to the next step S13 when determined that the voltages differences are not within the permissible range.

At step S13, the microcomputer 500 derives a path of the drive current $I_A$ to make the voltage differences between each of the battery cell groups 410, 420, 430 smaller, and generates current path data indicating the derived current path. In a case in which, for example, the voltage of the battery cell group 430 is determined to be smaller than the battery cell groups 410, 420 by an amount exceeding the permissible range, the microcomputer 500 generates current path data representing a current path indicated by the intermittent-line arrows in FIG. 8. Or, in a case in which, for example, the voltages of the battery cell groups 430, 420 are determined to be smaller than the voltage of the battery cell group 410 by an amount exceeding the permissible range, the microcomputer 500 generates current path data representing a current path indicated by the intermittent-line arrows in FIG. 9.

At step S14, the microcomputer 500 transmits the current path data generated at step S13 to each of the battery monitoring chips 100, 200, 300, and ends the present routine. The current path data transmitted from the microcomputer 500 is received by a communication section 115 of the battery monitoring chip 100. The current path control is transferred through the daisy chain formed between each of the battery monitoring chips to the battery monitoring chips 200 and 300.

Figure 11:
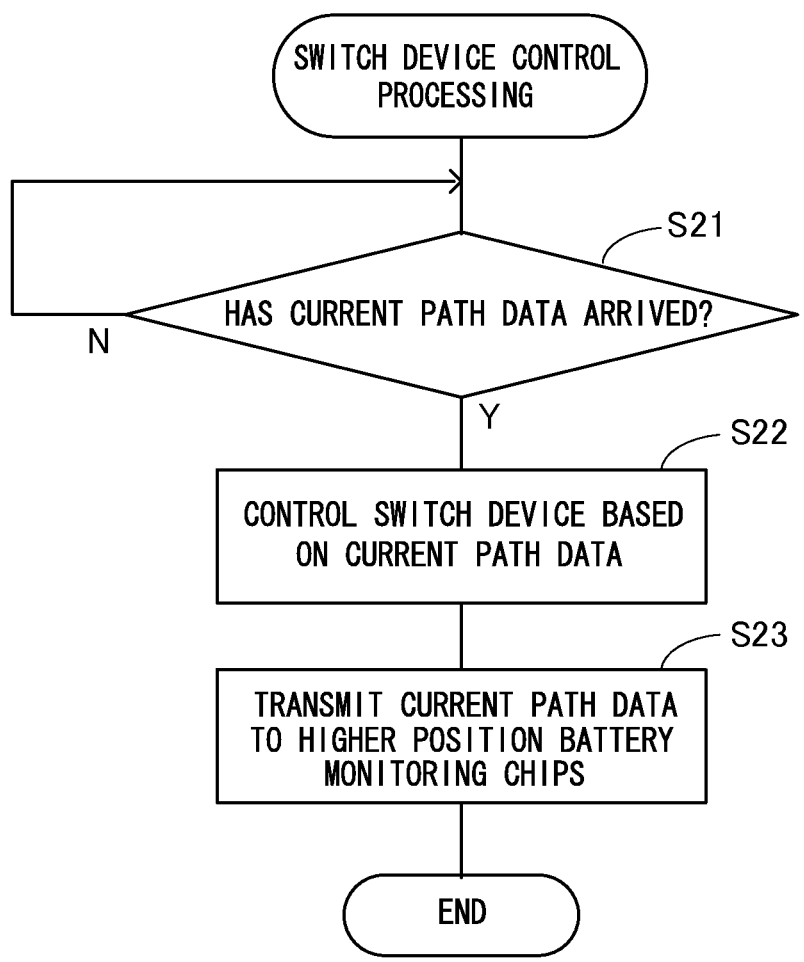
FIG. 11 is a flowchart illustrating flow of processing in a switching element control program according to an exemplary embodiment of the present invention.

FIG. 11 is a flowchart illustrating flow of processing of a switch device control program by which the chip internal controllers 114, 214, 314 of the respective battery monitoring chips 100, 200, 300 control the respective switch devices 151, 152, 251, 252, 351, 352. The program is a program executed by the respective chip internal controllers 114, 214, 314, and is pre-stored in a storage region of each of the chip internal controllers 114, 214, 314.

At step S21, the chip internal controllers 114, 214, 314 perform determination as to whether or not the above current path data generated by the microcomputer 500 has arrived. The chip internal controllers 114, 214, 314 transition processing to step S22 when the current path data has been received from the microcomputer 500 or the lower position battery monitoring chip.

At step S22, the chip internal controllers 114, 214, 314 perform ON/OFF control on the switch devices 151, 152, 251, 252, 351, 352 corresponding to the path to be formed by the drive current $I_A$ of the microcomputer 500 as indicated in the received current path data. For example, when the path of the drive current $I_A$ indicated by the current path data is the path indicated by the intermittent-line arrows in FIG. 8, the chip internal controller 114 of the battery monitoring chip 100 supplies gate signals to the switch device 151 and the switch device 152 so as to place the switch device 151 in an OFF state, and place the switch device 152 in an ON state. In such a case, the chip internal controller 214 of the battery monitoring chip 200 supplies gate signals to the switch device 251 and the switch device 252 so as to place the switch device 251 in an ON state, and place the switch device 252 in an OFF state.

At step S23, the chip internal controllers 114, 214 transfer the received current path data to the higher position battery monitoring chip, and end the present routine.

The battery monitoring system 2 according to the second exemplary embodiment includes a switching unit for switching the power reception path for driving each of the regulators of each of the plural battery monitoring chips according to the voltage differences between the plural battery cell groups from a path supplied from the higher position battery monitoring chip corresponding to a higher electrical potential than the battery cell group corresponding to the battery monitoring chip itself, to a path supplied from the battery cell group corresponding to the chip itself. Namely, the battery monitoring system 2 includes the switch devices 151, 152, 251, 252, 351, 352 as the above switching unit for performing switching between whether the power supply nodes, N1, N2, N3 of the regulators 120, 220, 320 provided within each of the battery monitoring chips 100, 200, 300 are connected to the regulator output of the higher position battery monitoring chip, or are connected to the battery cells. The switch devices 151, 152, 251, 252, 351, 352 are controlled according to the voltage differences between each of the battery cell groups. Namely, the battery monitoring system 2 enables the drive current $I_A$ supplied to the microcomputer 500 to be switched to a current path that does not pass through the battery cell group lower having a relatively low voltage level. Namely, according to the voltage differences between the battery cell groups 410, 420, 430, the reception path for receiving power to drive the regulators 120, 220, 320 can be switched from a path received from the higher position battery monitoring chip to a path received from the battery cell group corresponding to the battery monitoring chip itself. This thereby enables the power consumption of battery cell groups having a relatively large power consumption amount to be suppressed, enabling variation in the power consumption amount between battery cell groups to be eliminated.

Figure 12:
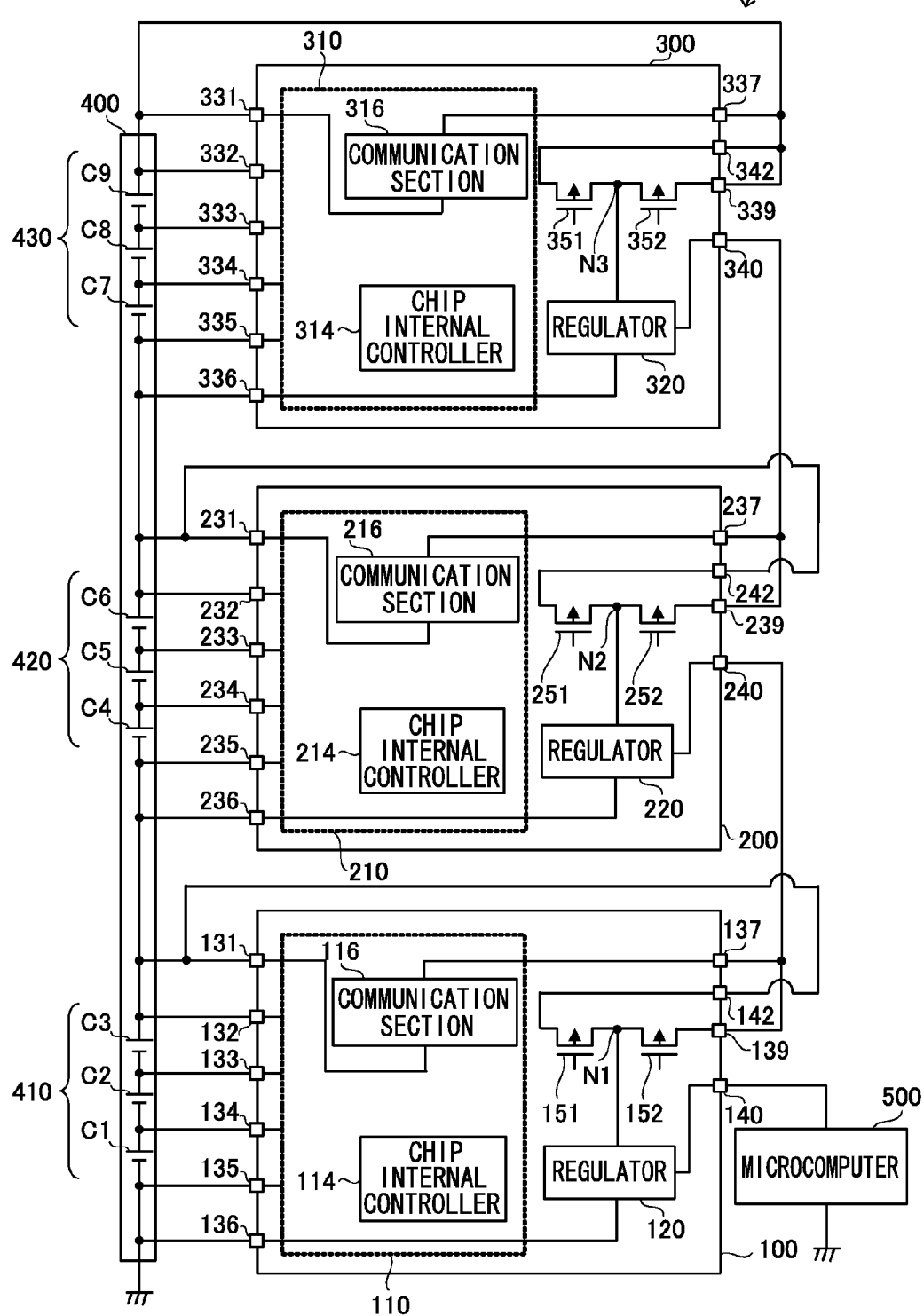
FIG. 12 is a configuration diagram of a battery monitoring system according to an exemplary embodiment of the present invention.

An explanation has been given in the present exemplary embodiment of a case in which the switch devices 151, 152, 251, 252, 351, 352 are P channel MOSFETs; however the switch devices may be configured as bipolar transistors. Explanation has been given in the present exemplary embodiment of a case in which the microcomputer 500 generates the current path data, and the chip internal controllers 114, 214, 314 perform ON/OFF control on the switch devices 151, 152, 251, 252, 351, 352 based on the current path data; however, the microcomputer 500 may generate switch control data that indicates the ON/OFF states of each of the switch devices. In the present exemplary embodiment, one end of each of the switch devices 151, 251, 351 is connected to the power supply terminals 131, 231, 331; however the one end may be connected to the cell voltage input terminals 132, 232, 332. The voltage of each of the battery cells is measured based on the electrical potentials of the cell voltage input terminals 132, 232, 332, and so preferably the electrical potentials of the cell voltage input terminals 132, 232, 332 are stabilized. The electrical potentials of the cell voltage input terminals 132, 232, 332 risk becoming unstable when the cell voltage input terminals 132, 232, 332 are connected to the power supply nodes N1, N2, N3 of the regulators through the switch devices 151, 251, 351. One end of the switch devices 151, 251, 351 is accordingly preferably connected to the power supply terminals 131, 231, 331. As illustrated in FIG. 12, one end of the switch devices 151, 251, 351 may be connected to terminals 142, 242, 342 leading out externally from the battery monitoring chips, and the terminals 142, 242, 342 connected to the power supply terminals 131, 231, 331 at the outside of the battery monitoring chips 100, 200, 300.

The present invention is not limited to the configurations of each of the battery monitoring systems according to the above exemplary embodiments, and various modifications may be made thereto.

Explanation has been given in each of the above exemplary embodiments of cases in which the total number of battery cells of the battery 400 is 9, with these formed into 3 battery cell groups including 3 battery cells in each. However, the total number of battery cells included in the battery 400, the number of battery cell groups, and the number of battery cells included in a single battery cell group may be increased or decreased as appropriate. There may also be a different number of battery cells between battery cell groups. Although each of the above exemplary embodiments is a configuration including three battery monitoring chips, the number of battery monitoring chips provided in a battery monitoring system may be increased or decreased as appropriate according to the number of battery cells of the battery subject to monitoring, and to the make-up of the battery cell groups etc.

Moreover, although the above exemplary embodiments are configured with the microcomputer 500 connected to the lowest position battery monitoring chip 100, the microcomputer 500 may be connected to a higher position battery monitoring chip (such as the battery monitoring chips 200 or 300).

In the above exemplary embodiments, for example in the battery monitoring chip 100, the regulator power supply terminal 139 and the communication terminal 138 are provided separately; however configuration may be made with these terminals combined into a single terminal. It is thereby possible to reduce the numbers of electrode pads of the battery monitoring chip 100, enabling a smaller chip surface area to be achieved.

In the above exemplary embodiments, cases are illustrated in which power is supplied to the microcomputer 500 through the battery monitoring chips 100, 200, 300; however, the supply destination of the drive power is not limited to a microcomputer, and, for example, another load may be employed, such as an isolator that separates between the high voltage side and the low voltage side.

In the above exemplary embodiments the regulators 120, 220, 320 are configured including a reference voltage source, an operational amplifier, resistance elements, and a P channel MOSFET; however the regulators 120, 220, 320 may be configured as a circuit configuration using a bipolar transistor.

A filter circuit may be inserted to prevent noise to the power supply terminals 131, 231, 331 and the cell voltage input terminals 132 to 135, 232 to 235, 332 to 335 of the respective battery monitoring chips 100, 200, 300.

The battery monitoring systems 1 and 2 of the above exemplary embodiments of the present invention are examples of battery monitoring system of the present invention. The battery monitoring chips 100, 200, 300 are examples of battery monitoring chips of the present invention. The microcomputer 500 is an example of a driven section of the present invention. The regulators 120, 220, 320 are examples of voltage generation sections of the present invention. The battery monitoring function sections 110, 210, 310 are examples of battery monitoring function sections of the present invention. The regulator power supply terminals 139, 239, 339 are examples of input ends and first terminals of the voltage generation section of the present invention. The regulator output terminals 140, 240, 340 are examples of output ends and second terminals of the voltage generation section of the present invention. The switch devices 151, 251, 351 are examples of first switch devices of the present invention and the switch devices 152, 252, 352 are examples of second switch devices of the present invention. The regulator output terminal 140 is an example of a battery of the present invention, and the battery cell groups 410, 420, 430 are examples of battery cell groups of the present invention.

What is claimed is:

1. A battery monitoring system for a battery containing a plurality of battery cells connected together in series, wherein mutually different portions from the plurality of battery cells form a plurality of battery cell groups, the battery monitoring system comprising:
a plurality of battery monitoring chips that each comprises
a battery monitoring function section that is provided so as to correspond to one of the battery cell groups and that monitors a state of each of battery cell included in the corresponding battery cell group, and
a voltage generation section that generates and supplies a drive voltage to a configuration circuit of the battery monitoring function section based on power supplied from the battery,
wherein the plurality of battery monitoring chips are connected together in series with a communication path for performing communication between each other, with an input end of the voltage generation section electrically connected to an output end of a voltage generation section of another battery monitoring chip from among the plurality of battery monitoring chips; and
a driven section that is connected to one battery monitoring chip from among the plurality of battery monitoring chips, and that is driven by a drive voltage generated by the voltage generation section of the one battery monitoring chip accompanying power consumption by each of the plurality of battery cells,
wherein the voltage generation section of the one battery monitoring chip is driven by a drive voltage generated by the voltage generation section of a battery monitoring chip in a higher position corresponding to a battery cell group in a higher position than the battery cell group corresponding to the one battery monitoring chip.

2. The battery monitoring system of claim 1, wherein the voltage generation section of the battery monitoring chip in a highest position corresponding to a highest position battery cell group from among the plurality of battery cell groups is driven by voltage of a battery cell in a highest position of the battery; and
the respective voltage generation sections of each of the battery monitoring chips other than the battery monitoring chip in the highest position are driven by a difference voltage supplied from the voltage generation section of a battery monitoring chip in a higher position corresponding to a battery cell group at a higher position than the battery cell group corresponding to the respective voltage generation section.

3. The battery monitoring system of claim 2, wherein each of the respective battery monitoring chips other than the battery monitoring chip in the highest position receives through a first terminal a drive voltage supplied from the voltage generation section of a battery monitoring chip in a higher position corresponding to a battery cell group at a higher position than the battery cell group corresponding to the respective battery monitoring chip, and outputs a drive voltage generated in the voltage generation section of the respective battery monitoring chip from a second terminal.

4. The battery monitoring system of claim 2, wherein the voltage generation section comprises an operational amplifier, and a transistor that generates the drive voltage based on a control signal supplied from the operational amplifier; and
in the respective voltage generation sections of the battery monitoring chip other than the battery monitoring chip in the highest position, the operational amplifier is driven by a drive voltage supplied from the voltage generation section of a battery monitoring chip in a higher position corresponding to a battery cell group at a higher position than the battery cell group corresponding to the respective voltage generation section, and generates the control signal, and the transistor generates a corresponding drive voltage from the drive voltage supplied from the voltage generation section of the battery monitoring chip in the higher position based on the control signal supplied from the operational amplifier.

5. The battery monitoring system of claim 1, further comprising:

a switching unit that, according to any voltage difference between the plurality of battery cell groups, switches a receipt path of power for respectively driving the voltage generation section of the plurality of battery monitoring chips from a receipt path from a battery monitoring chip in a higher position corresponding to a battery cell group at a higher position than the battery cell group corresponding to the respective battery monitoring chip to a receipt path from the battery cell group corresponding to the respective battery monitoring chip.

6. The battery monitoring system of claim 1, wherein the driven section controls each of the plurality of battery monitoring chips through the one battery monitoring chip.

7. A battery monitoring chip comprising:
a battery monitoring function section that, from among a plurality of battery cells of a battery containing the plurality of battery cells connected together in series, is provided so as to correspond to one battery cell group from among a plurality of battery cell groups each including a mutually different portion of battery cells from among the plurality of battery cells and to monitor a state of each of a plurality of battery cells configuring the one battery cell group connected together in series;
a first terminal that is input with a higher voltage than a voltage of the one battery cell group;
a voltage generation section that is driven by the voltage input to the first terminal and generates a drive voltage to supply to a configuration circuit of the battery monitoring function section; and
a second terminal that outputs the drive voltage generated by the voltage generation section.

8. The battery monitoring chip of claim 7, wherein the voltage generation section comprises:
an operational amplifier that is driven by the voltage supplied through the first terminal and generates a control signal; and
a transistor that, based on the control signal, generates the drive voltage from the voltage input from the first terminal and that outputs the generated drive voltage from the second terminal.

9. The battery monitoring chip of claim 7, further comprising:
a first switch device that in an ON state connects a power supply node of the voltage generation section to a terminal connected to the battery cell group; and
a second switch that in an ON state connects the power supply node of the voltage generation section to the first terminal.

10. The battery monitoring chip of claim 8, wherein the transistor of the voltage generation section has a highest withstand voltage from among all transistors in the battery monitoring chip.

* * * * *